(12) United States Patent
Watanabe

(10) Patent No.: US 7,767,380 B2
(45) Date of Patent: Aug. 3, 2010

(54) PHOTOPOLYMERIZATION TYPE PHOTOSENSITIVE LITHOGRAPHIC PRINTING PLATE PRECURSOR

(75) Inventor: Noriaki Watanabe, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 279 days.

(21) Appl. No.: 11/862,494

(22) Filed: Sep. 27, 2007

(65) Prior Publication Data
US 2008/0076066 A1 Mar. 27, 2008

(30) Foreign Application Priority Data
Sep. 27, 2006 (JP) ............................. 2006-263214

(51) Int. Cl.
*G03F 7/11* (2006.01)
(52) U.S. Cl. .............. 430/275.1; 430/276.1; 430/272.1; 430/278.1; 430/273.1; 430/271.1
(58) Field of Classification Search ........................ None
See application file for complete search history.

(56) References Cited

U.S. PATENT DOCUMENTS

| | | | | |
|---|---|---|---|---|
| 6,649,323 B2 * | 11/2003 | Pappas et al. | ............ | 430/271.1 |
| 6,844,136 B1 * | 1/2005 | Lifka et al. | ............... | 430/281.1 |
| 2005/0031986 A1 * | 2/2005 | Kakino et al. | ............ | 430/270.1 |
| 2006/0257782 A1 * | 11/2006 | Maemoto | ................. | 430/270.1 |

FOREIGN PATENT DOCUMENTS

| | | | |
|---|---|---|---|
| EP | 0 275 147 A2 * | 7/1988 | |
| EP | 1 640 803 A2 | 3/2006 | |
| EP | 1 698 934 A1 | 9/2006 | |
| EP | 1705002 A1 * | 9/2006 | |
| EP | 1 767 994 A2 * | 3/2007 | |
| JP | 2001-512251 A | 8/2001 | |
| JP | 2002-221789 A | 8/2002 | |
| JP | 2003-43703 A | 2/2003 | |
| JP | 2005-43658 A | 2/2005 | |
| JP | 2005-215399 A | 8/2005 | |
| JP | 2006-113343 A | 4/2006 | |
| JP | 2007-233304 A * | 9/2007 | |
| WO | 99/06890 A1 | 2/1999 | |

OTHER PUBLICATIONS

Huha et al,.Journal of the American Ceramic Society, vol. 83, No. 8 year 2000, pp. 1957-1963, obtained http://www3.interscience.wiley.com/journal/119000849/abstract?CRETRY=1&SRETRY=0.*
Nakano et al, Bull. Chem. Soc.Jpn, vol. 70, pp. 2943-2949, year 1997 obtained http://www.jstage.jst.go.jp/article/bcsj/70/12/70_2943/_article.*
English translation of JP, 2007-233304 A (2007) from machine translation from AIPN Japan Patent Office National Center for Industrial Property Information and Training, generated Aug. 23, 2009, 50 pages.*
DERWENT-Acc-No: 2008-D40129, English abstract of JP 2007-233304A, Derwent Information LTD, year 2008 (Derwent Week 200825), 3 pages.*
Extended European Search Report dated Apr. 14, 2008.
K. Petrak et al., "Permeability of Oxygen through Polymers. II. The Effect of Humidity and Film Thickness on the Permeation and Diffusion Coefficients", Journal of Applied Polymer Science, 1980, pp. 879-886, vol. 25, John Wiley & Sons, Inc.
European Patent Office Communication issued in counterpart application No. 07019032.7 - 1235 dated Jan. 13, 2010.

* cited by examiner

*Primary Examiner*—Cynthia Hamilton
(74) *Attorney, Agent, or Firm*—Sughrue Mion, PLLC

(57) ABSTRACT

A negative-working photopolymerization type photosensitive lithographic printing plate precursor capable of conducting image recording with laser, includes: a hydrophilic support; a photopolymerizable photosensitive layer containing (i) a sensitizing dye having an absorption maximum in a wavelength range of from 360 to 450 nm, (ii) a hexaarylbiimidazole compound and (iii) an addition polymerizable compound having an ethylenically unsaturated double bond; and a protective layer, in this order, wherein the protective layer has oxygen permeability at 25° C. under one atmosphere of from 25 ml/m$^2$·day to 200 ml/m$^2$·day.

6 Claims, No Drawings

PHOTOPOLYMERIZATION TYPE PHOTOSENSITIVE LITHOGRAPHIC PRINTING PLATE PRECURSOR

FIELD OF THE INVENTION

The present invention relates to a photosensitive lithographic printing plate precursor, and more particularly to a negative-working photosensitive lithographic printing plate precursor suitable for conducting drawing with a laser beam and suitable for high definition AM screen printing of screen line number of 200 or more or FM screen printing.

BACKGROUND OF THE INVENTION

Heretofore, a lithographic printing plate is obtained by a plate-making method wherein a photosensitive lithographic printing plate precursor having a construction comprising a photosensitive resin layer provided on a support having a hydrophilic surface is ordinarily subjected to floodwise exposure (mask exposure) via a lith film and then the non-image area is removed with a developer. However, with the recent progress of digitized techniques, a computer-to-plate (CTP) technique of directly conducting exposure process on the surface of the lithographic printing plate precursor by scanning according to digitized image data with highly convergent light, for example, a laser beam, without using a lith film has been developed. Photosensitive lithographic printing plate precursors adapted for the technique have also been developed.

As the photosensitive lithographic printing plate precursor suitable for exposure with a laser beam, a photosensitive lithographic printing plate precursor having a polymerizable photosensitive layer is exemplified. Such a photosensitive lithographic printing plate precursor is preferable because the polymerizable photosensitive layer is easily enable to increase sensitivity by appropriately selecting a photopolymerization initiator or a photopolymerization initiation system (hereinafter also simply referred to as an "initiator" and an "initiation system", respectively) in comparison with other conventional photosensitive layers.

However, when an image is drawn on such a photosensitive lithographic printing plate precursor with a laser beam, a region of insufficient polymerization is formed in the edge of image due to an inadequate exposure amount depending on an energy distribution profile of the laser beam. Thus, sharpness of the edge of image is impaired, resulting in decrease in resolution. Also, in the region of insufficient polymerization formed in the edge of image, defect of removal occurs depending on alkali concentration of a developer or condition of a developing brush in a development processing step to cause a large variation of halftone dot area in a printing plate formed.

Moreover, since such a lithographic printing plate precursor comprises a support having a roughened surface according to electrolytic treatment or brush treatment in order to ensure hydrophilicity, image quality and sharpness are additionally injured and reproducibility in the shadow area is severely degraded due to scattering of reflection light at the laser exposure.

On the other hand, requirements for the high definition AM screen printing or FM screen printing have recently increased in the field of CTP technique. Therefore, the resolution of lithographic printing plate precursor becomes an important performance.

The FM (Frequency Modulation) screen comprises fine halftone dots of approximately 20 microns irregularly arranged irrespective of screen angle and line number and expresses density gradation by halftone dot density per unit area. The features of FM screen print are that interference moire and rosette pattern do not occur, that tone jump in a halftone area having a halftone dot area ratio of approximately 50% is avoided, and that due to the small size of halftone dot, overlap of halftone dots decreases so that the color reproduced can be brilliantly seen.

In contrast to the FM screen, the AM (Amplitude Modulation) screen comprises halftone dots regularly arranged at a certain angle and expresses density gradation by halftone dot size per unit area. In Japan, a line number of the ordinary AM screen is 175 lines per inch. On the other hand, printing using a screen line number of 200 or more is defined as the high definition AM screen printing.

The characteristics of high definition print include decreases in the moire and rosette pattern, improvement in texture of image and improvements in feeling of reality and reproducibility of detail.

However, lithographic printing plate precursors accompanying the degradation of reproducibility in the shadow area, for example, the lithographic printing plate precursors having the polymerizable photosensitive layer described above are difficult to use for the purpose of providing printing plates suitable for the FM screen printing or high definition AM screen printing, because they cannot reproduce extremely fine halftone dots.

In JP-A-2003-43703, a photosensitive lithographic printing plate comprising a support having provided thereon an intermediate layer containing a polymer compound including a constituent unit having a sulfonic acid group in its side chain and a polymerizable photosensitive layer in order is described. However, the photosensitive lithographic printing plate is still insufficient for a printing plate precursor suitable for the high definition AM screen printing or FM screen printing. Particularly, since unevenness of halftone dot with the FM screen is severe, it is difficult to use the FM screen.

Also, it is commonly known that the polymerizable photosensitive layer is apt to decrease its sensitivity on polymerization inhibition due to oxygen present in the air. In order to prevent the decrease in the sensitivity, a protective layer is ordinarily provided on the polymerizable photosensitive layer. However, when oxygen permeability of the protective layer is decreased in order to prevent the polymerization inhibition due to oxygen, deterioration of developing property due to the polymerization in the dark is accompanied and it is difficult to consist with the preservation stability. In JP-A-2003-43703, although the attempt for the sensitivity to consist with the preservation stability was made by adding a polymerization inhibitor, the preservation stability was not sufficiently achieved.

In JP-A-2005-43658, a technique of using polyvinyl alcohol together with a vinyl caprolactam copolymer in a protective layer is described for the purpose of improving humidity dependence of a lithographic printing plate precursor having a photopolymerizable photosensitive layer. However, the lithographic printing plate precursor in JP-A-2005-43658 has a problem in that reproducibility in a shadow area is insufficient.

In JP-A-2006-113343, a lithographic printing plate material having a protective layer containing polyvinyl alcohol having a saponification degree of 85% to 100% and a water-insoluble cationic resin particle having Tg of less than 35° C. is described for the purpose of providing a lithographic printing plate material excellent, for example, in sensitivity, adhesion property of a protective layer or removability of the protective layer. However, the lithographic printing plate material in JP-A-2006-113343 also has a problem in that the reproducibility in a shadow area is insufficient.

In JP-T-2001-512251 (corresponding to WO 99/06890), a lithographic printing plate having a protective layer containing poly(1-vinylimidazole) or a copolymer of 1-vinylimidazole and at least one other monomer provided on a photosensitive layer is described for the purpose of improving oxygen impermeable property and adhesion property to an organic substrate. However, the lithographic printing plate in JP-T-2001-512251 (corresponding to WO 99/06890) has a problem of low sensitivity.

In JP-A-2002-221789, a technique of adding a nitrogen atom-containing heterocyclic photopolymerization intiator and a nitrogen atom-containing polymerizable monomer to a photosensitive layer is described for the purpose of providing a photopolymerizable lithographic printing plate improved, for example, in handling properties in a bright room and preservation stability. However, the lithographic printing plate in JP-A-2002-221789 has a problem in that the reproducibility in a shadow area and the sensitivity are insufficient.

SUMMARY OF THE INVENTION

An object of the present invention is to provide a photosensitive lithographic printing plate precursor, which is suitable for conducting drawing with a laser beam and suitable for high definition AM screen printing of screen line number of 200 or more or FM screen printing, particularly, which is excellent in uniformity of halftone dot in the halftone area in case of using the FM screen, and which is excellent in the reproducibility in a shadow area, preservation stability and sensitivity.

As a result of intensive investigations, the inventors have found that the above-described object can be achieved by the constitution described below.

(1) A negative-working photopolymerization type photosensitive lithographic printing plate precursor capable of conducting image recording with laser comprising a hydrophilic support, a photopolymerizable photosensitive layer containing (i) a sensitizing dye having an absorption maximum in a wavelength range of 360 to 450 nm, (ii) a hexaarylbiimidazole compound and (iii) an addition polymerizable compound having an ethylenically unsaturated double bond and a protective layer provided in this order, wherein the protective layer has oxygen permeability (A) at 25° C. under one atmosphere of $25 \leqq (A) \leqq 200$ (ml/m²·day).

(2) The negative-working photopolymerization type photosensitive lithographic printing plate precursor as described in (1) above, wherein the protective layer is composed of a mixture of polyvinyl alcohol having a saponification degree of 95% by mole or more and a water-soluble resin having oxygen permeability higher than oxygen permeability of the polyvinyl alcohol having a saponification degree of 95% by mole or more in a mixing ratio (weight ratio) of 9:1 to 1:9.

(3) The negative-working photopolymerization type photosensitive lithographic printing plate precursor as described in (2) above, wherein the water-soluble resin having oxygen permeability higher than oxygen permeability of the polyvinyl alcohol having a saponification degree of 95% by mole or more is at least one member selected from a vinyl pyrrolidone/vinyl imidazole copolymer, a vinyl pyrrolidone/vinyl caprolactam copolymer and an anion-modified polyvinyl alcohol.

(4) The negative-working photopolymerization type photosensitive lithographic printing plate precursor as described in any one of (1) to (3) above, wherein a dry coating weight of the protective layer is from 2.1 to 2.7 g/m².

(5) The negative-working photopolymerization type photosensitive lithographic printing plate precursor as described in any one of (1) to (4) above, wherein the photopolymerizable photosensitive layer further contains a binder polymer containing structural units represented by the following formulae (1) to (3):

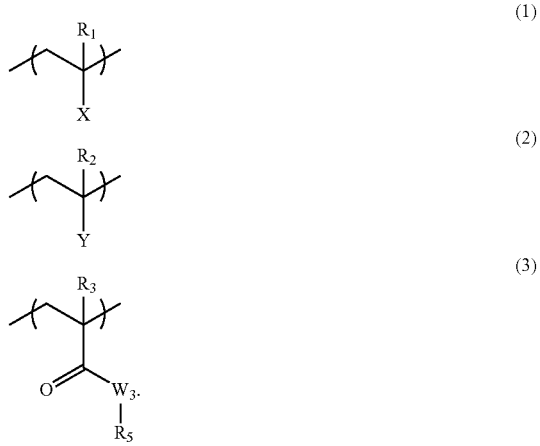

In formulae (1) to (3), $R_1$ and $R_2$ each independently represents a hydrogen atom or an alkyl group having from 1 to 6 carbon atoms, $R_3$ represents a hydrogen atom, an alkyl group having from 1 to 6 carbon atoms or a substituted alkyl group having from 1 to 6 carbon atoms which is substituted with a hydroxy group, a halogen atom, an amino group, a methoxy group or a carboxyl group, X represents a functional group selected from —COOH, —CO—$W_1$-$L_1$-COOH and —SO$_3$H, $W_1$ represents an oxygen atom, a sulfur atom or a —NH— group, $L_1$ represents a divalent organic group, Y represents —CO—O—CH$_2$—CH=CH$_2$ group or a —CO—$W_2$-$L_2$O—CO—CR$_4$=CH$_2$ group, $W_2$ represents an oxygen atom, a sulfur atom or a —NH— group, $L_2$ represents a divalent organic group, $R_4$ represents a hydrogen atom or an alkyl group having from 1 to 6 carbon atoms, $W_3$ represents an oxygen atom, a sulfur atom or an —NH— group, and $R_5$ represents an alkyl group having from 1 to 18 carbon atoms, an alkyl group containing an alicyclic structure having from 5 to 20 carbon atoms or a group containing an aromatic ring having from 6 to 20 carbon atoms.

(6) The negative-working photopolymerization type photosensitive lithographic printing plate precursor as described in any one of (1) to (5) above which further comprises an intermediate layer containing a metal oxide obtained by hydrolysis and polycondensation of an organic metal compound or inorganic metal compound between the hydrophilic support and the photopolymerizable photosensitive layer.

According to the present invention, a photosensitive lithographic printing plate precursor can be provided, which is suitable for conducting drawing with a laser beam and suitable for high definition AM screen printing of screen line number of 200 or more or FM screen printing, particularly, which is excellent in uniformity of halftone dot in the halftone area in case of using the FM screen, and which is excellent in the reproducibility in a shadow area, preservation stability and sensitivity.

DETAILED DESCRIPTION OF THE INVENTION

Photopolymerization Type Photosensitive Lithographic Printing Plate Precursor With respect to the photopolymerization type photosensitive lithographic printing plate precursor having a spectral sensitivity in a wavelength range of 360 to 450 nm according to the invention, the constitutions thereof will be described in order below.

[Support]

First, a support for use in the photopolymerization type photosensitive lithographic printing plate according to the invention is described below.

As for the support used in the invention, although any support having a hydrophilic surface can be employed, it is preferably a dimensionally stable plate-like material, for example, paper, paper laminated with plastic (for example, polyethylene, polypropylene or polystyrene), a plate of metal (for example, aluminum, zinc or copper) or alloy (for example, alloy of aluminum with silicon, copper, magnesium, chromium, zinc, lead, bismuth or nickel), a film of plastic (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film having laminated with or vapor-deposited thereon the above-described metal or alloy. Among these supports, the aluminum plate is particularly preferred, because it is extremely dimensional stable and relatively inexpensive. Also, a composite sheet comprising a polyethylene terephthalate film having bonded thereon an aluminum sheet described in JP-B-48-18327 (the term "JP-B" as used herein means an "examined published Japanese patent publication") is preferred. The thickness of the support is approximately from 0.05 to 1 mm.

In the case of using a support having a metal surface, particularly an aluminum surface, it is preferred that the support is subjected to surface treatment for example, graining treatment, immersion treatment in an aqueous solution of sodium silicate, potassium fluorozirconate, a phosphate or the like, or anodizing treatment, described below.

A method for the graining treatment includes mechanical graining, chemical etching and electrolytic graining, as described in JP-A-56-28893. Specifically, there may be employed an electrochemically graining method of electrochemically graining the surface in an electrolytic solution of hydrochloric acid or nitric acid and a mechanical graining method, for example, a wire brush graining method of scratching the aluminum surface with a metal wire, a ball graining method of graining the aluminum surface with grinding balls and an abrasive and a brush graining method of graining the aluminum surface with a nylon brush and an abrasive. The graining methods may be employed individually or in combination thereof.

Of the methods, the electrochemical method of chemically graining the surface in an electrolytic solution of hydrochloric acid or nitric acid is a surface roughening method suitably used in the invention, and suitable current density is in a range of 100 to 400 C/dm$^2$. More specifically, it is preferred to conduct electrolysis in an electrolytic solution containing from 0.1 to 50% by weight hydrochloric acid or nitric acid under the conditions from 20 to 100° C. in temperature, from 1 second to 30 minutes in time and from 100 to 400 C/dm$^2$ in current density.

The aluminum support subjected to the graining treatment is then chemically etched with an acid or an alkali. The method of using an acid as an etching agent takes time for destroying fine structures and thus, it is disadvantageous to industrially apply the method to the invention. Such disadvantage can be overcome by using an alkali as the etching agent.

Examples of the alkali agent preferably used in the invention include sodium hydroxide, sodium carbonate, sodium aluminate, sodium metasilicate, sodium phosphate, potassium hydroxide and lithium hydroxide. Preferable ranges of concentration and temperature are form 1 to 50% by weight and from 20 to 100° C., respectively. The alkali etching is preferably performed so that a dissolution amount of aluminum is in a range of 5 to 20 g/m$^3$.

After the etching procedures the support is subjected to washing with an acid for removing stain (smut) remaining on the surface thereof. Examples of the acid for use in the acid-washing step include nitric acid, sulfuric acid, phosphoric acid, chromic acid, hydrofluoric acid and borohydrofluoric acid. In particular, as the method for removing smut after the electrochemical graining treatment, a method of bringing the aluminum support into contact with a 15 to 65% by weight aqueous solution of sulfuric acid having a temperature of 50 to 90° C. as described in JP-A-53-12739 and a method of performing alkali etching as described in JP-B-48-28123 are preferably exemplified.

In the invention, surface roughness (Ra) of the aluminum support is preferably from 0.3 to 0.7 μm.

The aluminum support thus-treated may be then subjected to anodizing treatment. The anodizing treatment can be conducted in a manner conventionally used in the field of art.

Specifically, it is performed by applying a direct current or alternating current to the aluminum support in an aqueous solution or non-aqueous solution containing sulfuric acid, phosphoric acid, chromic acid, oxalic acid, sulfamic acid, benzenesulfonic acid or a combination of two or more thereof to form an anodic oxide layer on the surface of aluminum support.

The conditions of anodizing treatment cannot be determined in a general way, since they are widely varied depending on the electrolytic solution to be used. Ordinarily, however, a concentration of the electrolytic solution is in a range of 1 to 80% by weight, a temperature of the electrolytic solution is in a range of 5 to 70° C., a current density is in a range of 0.5 to 60 ampere/dm$^2$, a voltage is in a range of 1 to 100 V, and a period of electrolysis is in a range of 10 to 100 seconds.

Of the anodizing treatments, a method of anodizing in a sulfuric acid solution with a high current density as described in British Patent 1,412,768 and a method of anodizing using phosphoric acid as an electrolytic bath as described in U.S. Pat. No. 3,511,661 are preferably used.

In the invention, the amount of anodic oxide layer is preferably from 1 to 10 g/m$^2$. When the amount is less than 1 g/m$^2$, scratch may be a to occur in the plate. The amount exceeding 10 g/m$^2$ is disadvantageous from an economical standpoint because a large amount of electricity is necessary. The amount of anodic oxide layer is more preferably from 1.5 to 7 g/m$^2$, and still more preferably from 2 to 5 g/m$^2$.

In the invention, the aluminum support may further be subjected to sealing treatment after the graining treatment and anodizing treatment. The sealing treatment is performed by immersing the aluminum support in hot water or a hot aqueous solution containing an inorganic salt or an organic salt, or transporting the aluminum support in a water vapor bath. Moreover, the aluminum support for use in the invention may be subjected to surface treatment other than silicate treatment with an alkali metal silicate, for example, immersion treatment in an aqueous solution, for example, of potassium fluorozirconate or a phosphate.

According to the invention, to a support (in case of using an aluminum support, the aluminum support appropriately subjected to the above-described surface treatments is preferred), a photopolymerizable photosensitive layer comprising, for example, a photopolymerization type photosensitive composition is applied and then a protective layer is applied to prepare a photopolymerization type photosensitive lithographic printing plate. Before the application of the photopolymerizable photosensitive layer, if desired, an organic or inorganic undercoat layer or an intermediate layer described hereinafter may be provided on the support.

[Undercoat Layer]

A substance for forming the organic undercoat layer includes, for example, a water-soluble resin, e.g., polyvinylphosphonic acid, a polymer or copolymer having a sulfonic acid group in the side chain thereof polyacrylic acid, carboxymethyl cellulose, dextrin or gum arabic, a low molecular weight organic compound, for example, a phosphonic acid having an amino group (e.g., 2-aminoethylphosphonic acid), an organic phosphonic acid (e.g., phenylphosphonic acid, naphthylphosphonic acid, alkylphosphonic acid, glycerophosphonic acid, methylenediphosphonic acid or ethylenediphosphonic acid, each of which may have a substituent), an organic phosphoric acid (e.g., phenylphosphoric acid, naphthylphosphoric acid, alkylphosphoric acid or glycerophosphoric acid, each of which may have a substituent), an organic phosphinic acid (e.g., phenylphosphinic acid, naphthylphosphoric acid, alkylphosphoric acid or glycerophosphoric acid, each of which may have a substituent), an amino acid (e.g., glycine or β-alanine), a hydrochloride of an amine containing a hydroxy group (e.g., triethanolamine hydrochloride), a water-soluble metal salt (e.g., zinc borate), a yellow dye and an amine salt.

The organic compounds may be used individually or as a mixture of two or more thereof.

The organic undercoat layer can be provided in the following manner. Specifically, the organic compound as described above is dissolved in water, an organic solvent, for example, methanol, ethanol or methyl ethyl ketone, or a mixture thereof, the solution thus prepared is applied to the support and dried to form the organic undercoat layer. Alternatively, the organic compound as described above is dissolved in water, an organic solvent, for example, methanol, ethanol or methyl ethyl ketone, or a mixture thereof, and the support is immersed in the solution thus prepared to adsorb the organic compound on the surface of support, then washed, for example, with water and dried to form the organic undercoat layer. In the former method, the solution containing the organic compound in concentration of 0.005 to 10% by weight is coated by means of various methods. Any method, for example, bar coater coating, spin coating, spray coating or curtain coating can be employed. In the latter method, the concentration of the organic compound in the solution is preferably from 0.01 to 20% by weight and more preferably from 0.05 to 51% by weight. The immersion temperature is preferably from 20 to 90° C., and more preferably from 25 to 50° C. The immersion time is preferably from 0.1 second to 20 minutes, and more preferably from 2 seconds to one minute.

The solution of organic compound may be used by adjusting the pH thereof in a range of 1 to 12 with a basic substance, for example, ammonia, triethylamine or potassium hydroxide, or an acidic substance, for example, hydrochloric acid or phosphoric acid. Further, a yellow dye may be added to the solution in order to improve tone reproducibility of the photopolymerization type photosensitive lithographic printing plate precursor.

The coating amount of the organic undercoat layer after drying is preferably from 2 to 200 mg/m$^2$, and more preferably from 5 to 100 mg/m$^2$. When the coating amount is less than 2 mg/m$^2$, sufficient printing durability is not achieved. On the other hand, when the coating amount is more than 200 mg/m$^2$, sufficient printing durability is also not achieved.

A substance for use in the inorganic undercoat layer includes an inorganic salt, for example, cobalt acetate, nickel acetate or potassium fluorotitanate. The method for the formation of the inorganic undercoat layer is same as that of the organic undercoat layer described above.

[Intermediate Layer]

The intermediate layer according to the invention contains (i) a metal oxide obtained by hydrolysis and polycondensation of an organic metal compound or inorganic metal compound, and an embodiment containing (ii) a colloidal silica sol and (iii) an organic polymer compound in addition to the metal oxide is preferable. The intermediate layer may further include a plasticizer.

The metal oxide for use in the intermediate layer includes silica (silicon oxide), titanium oxide, boron oxide, aluminum oxide, zirconium oxide and a composite thereof. The metal oxide in the intermediate layer for use in the invention is obtained by coating on the surface of a support a so-called sol-gel reaction solution prepared by conducting hydrolysis and polycondensation reaction of an organic metal compound or inorganic metal compound in water and an organic solvent in the presence of a catalyst, for example, an acid or alkali and drying. The organic metal compound or inorganic metal compound used includes, for example, a meta alkoxide, a metal acetylacetonate, a metal acetate, a metal oxalate, a metal nitrate, a metal sulfate, a metal carbonate, a metal oxychloride, a metal chloride and a condensate obtained by partial hydrolysis and oligomeration thereof.

The metal alkoxide is represented by the following formula:

$$M(OR)_n$$

wherein M represents a meal element, R represents an alkyl group, and n represents an oxidation number of the metal element.

Examples of the metal alkoxide include $Si(OCH_3)_4$, $Si(OC_2H_5)_4$, $Si(OC_3H_7)_4$, $Si(OC_4H_9)_4$, $Al(OCH_3)_4$, $Al(OC_2H_5)_4$, $Al(OC_3H_7)_4$, $Al(OC_4H_9)_4$, $B(OCH_3)_4$, $B(OC_2H_5)_4$, $B(OC_3H_7)_4$, $B(OC_4H_9)_4$, $Ti(OC_2H_5)_4$, $Ti(OC_2H_5)_4$, $Ti(OC_3H_7)_4$, $Ti(OC_4H_9)_4$, $Zr(OCH_3)_4$, $Zr(OC_2H_5)_4$, $Zr(OC_3H_7)_4$ and $Zr(OC_4H_9)_4$. Also, an alkoxide of Ge, Li, Na, Fe, Ga, Mg, P, Sb, Sn, Ta, V or the like is exemplified. Further, a mono-substituted silicon alkoxide, for example, $CH_3Si(OCH_3)_3$, $C_2H_5Si(OCH_3)_3$, $CH_3Si(OC_2H_5)_3$ or $C_2H_5Si(OC_2H_5)_3$ is also used. Examples of the metal acetylacetonate include $Al(COCH_2COCH_3)_3$ and $Ti(COCH_2COCH_3)_4$. Examples of the metal oxalate include $K_2TiO(CO)_2$. Examples of the metal nitrate include $Al(NO)_3$ and $ZrO(NO_3)_2.2H_2O$. Examples of the metal sulfate include $Al_2(SO_4)_3$, $(NH_4)Al(SO_4)_2$, $KAl(SO_4)_2$ and $NaAl(SO_4)_2$.

Examples of the metal oxychloride include $Si_2OCl_6$ and $ZrOCl_2$. Examples of the metal chloride include $AlCl_3$, $SiCl_4$, $ZrCl_2$ and $TiCl_4$.

The organic metal compounds or inorganic metal compounds may be used individually or in combination of two or more thereof.

According to the invention, it is preferred that the intermediate layer contains an organic silicone compound having a functional group capable of causing an addition polymerization upon a radical. By the introduction of the organic silicone compound, a balance of the adhesion property between the intermediate layer and photosensitive layer with the occurrence of scum at the development processing is more improved.

When the functional group capable of causing an addition polymerization upon a radical is represented by $R_1$, the organic silicone compound includes an organic silicone compound represented by the following formula (1):

$$R_1Si(OR_2)_3 \qquad (1)$$

In formula (1), $-OR_2$ represents an alkoxy group capable of being hydrolyzed or a $-OCOCH_3$ group.

$R_1$ in formula (1) is not particularly restricted and includes, for example, $CH_2=CHCOO-(CH_2)_3-$, $CH_2=C(CH_3)COO-(CH_2)_3-$, $CH=CH-C(=CH_2)-$, $CH_2=CH-SO_2NH-(CH_2)_3-$,

$CH_2=CH-$, $-HC\equiv C-$, $CH_3C\equiv C-$,

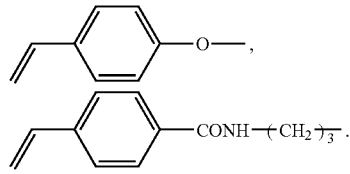

$CH_2=CHCH_2O-$, $CH_2=CHCOO-(CH_2)_4-$, $CH_2=C(CH_3)COO-(CH_2)_4-$, $CH_2=C(CH_3)COO-(CH_2)_5-$, $CH_2=CHCH_2-$, $HO-CH_2-C\equiv C-$, $CH_3CH_2CO-C\equiv C-$, $CH_2=CHS-(CCH_2)_3-$, $CH_2=CHCH_2O-(CH_2)_2-SCH_2-$, $CH_2=CHCH_2S-(CH_2)_3-S-$, $(CH_3)_3-CCO-C\equiv C-$, $CH_2=CHCH_2NH-(CH_2)_3-$, $(CH_2=CH)_2-N-(CH_2)_2-SCH_2-$,

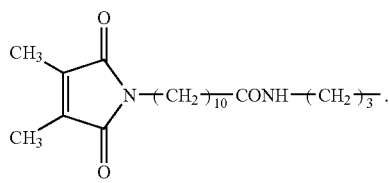

and

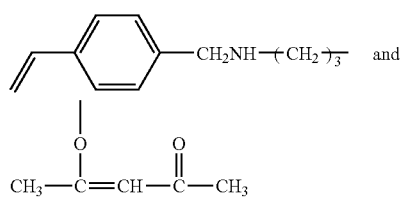

Specific, examples of the organic silicone compound represented by formula (1) for use in the invention are set forth below.

$CH_2=CH-Si(OCOCH_3)_3$, $CH_2=CH-Si(OC_2H_5)_3$, $CH_2=CHSi(OCH_3)_3$, $CH_2=CHCH_2Si(OC_2H_5)_3$, $CH_2=CHCH_2NH(CH_2)_3Si(OCH_3)_3$, $CH_2=CHCOO-(CH_2)_3-Si(OCH_3)_3$, $CH_2=CHCOO-(CH_2)_3-Si(OC_2H_5)_3$, $CH_2=C(CH_3)COO-(CH_2)_3-Si(OCH_3)_3$, $CH_2=C(CH_3)COO-(CH_2)_3-Si(OC_2H_5)_3$, $CH_2=C(CH_3)COO-(CH_2)_4-Si(OCH_3)_3$, $CH_2=C(CH_3)COO-(CH_2)_5-Si(OCH_3)_3$, $CH_2=CHCOO-(CH_2)_4-Si(OCH_3)_3$,

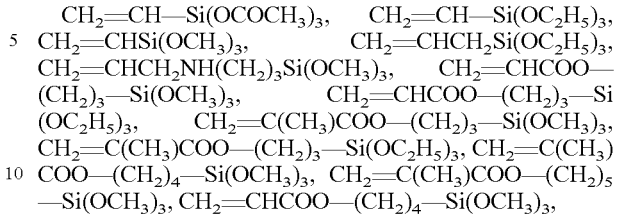

$CH_2=CH-SO_2NH-(CH_2)_3-Si(OCH_3)_3$,

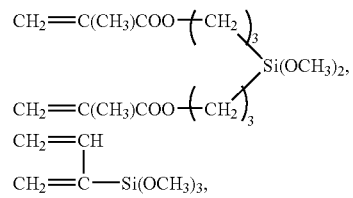

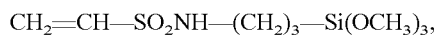

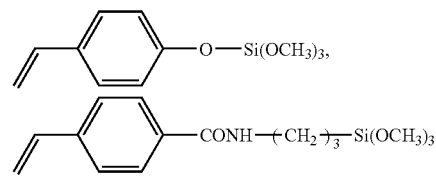

$HC\equiv C-Si(OC_2H_5)_3$, $CH_3C\equiv C-Si(OC_2H_5)_3$,

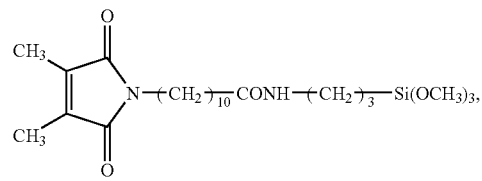

$CH_2=CHCH_2O-Si(OCH_3)_3$, $(CH_2=CHCH_2O)_4Si$, $HO-CH_2=C-Si(OCH_2OCH_3)$, $CH_3CH_2CO-C\equiv C-Si(OC_2H_5)_3$, $CH_2=CHS-(CH_2)_3-Si(OCH_3)_3$, $CH_2=CHCH_2O-(CH_2)_2-SCH_2-Si(OCH_3)_3$, $CH_2=CHCH_2S-(CH_2)_3-S-Si(OCH_3)_3$, $(CH_3)_3CCO-C\equiv C-Si(OC_2H_5)_3$, $(CH_2=CH)_2-N-(CH_2)_2-SCH_2-Si(OCH_3)_3$,

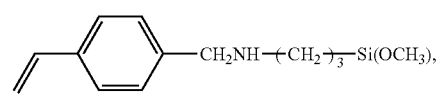

and $CH_3COCH=C(CH_3)-O-Si(OCH_3)_3$.

In the case of using the metal alkoxide, as for a ratio to the organic silicone compound, a molar ratio of the metal alkoxide to the organic silicone compound is suitably from 0.05 to 200, preferably from 0.2 to 100, and more preferably from 1 to 40. In the ratio described above, the effect for reducing the generation of scum at the development processing is more increased. Further, the adhesion property to the photosensitive layer is increased and printing durability and reproducibility of halftone dot are increased. As a means for achieving the ratio, for example, control of the sol-gel reaction (remaining organic property), adjustment of a mixing ration of the metal alkoxide and the organic silicone compound and adjustment due to an additive (for example, an organic polymer or a plasticizer) are exemplified.

On the other hand, as the catalyst, an organic or inorganic acid or alkali is used. Examples of the catalyst include an inorganic acid, for example, hydrochloric acid, sulfuric acid, sulfurous acid, nitric acid, nitrous acid, hydrofluoric acid, phosphoric acid or phosphorous acid, an organic acid, for example, formic acid, acetic acid, propionic acid, butyric acid, glycolic acid, chloroacetic acid, dichloroacetic acid, trichloroacetic acid, fluoroacetic acid, bromoacetic acid, methoxyacetic acid, oxaloacetic acid, citric acid, oxalic acid, succinic acid, malic acid, tartaric acid, fumaric acid, maleic acid, malonic acid, ascorbic acid, benzoic acid, a substituted benzoic acid, e.g., 3,4-dimethoxybenzoic acid, phenoxyacetic acid, phthalic acid, picric acid, nicotinic acid, picolinic acid, pyrazine, pyrazole, dipicolinic acid, azipic acid, p-toluilic acid, terephthalic acid, 1,4-cyclohexene-2,2-dicarboxylic acid, erucic acid, lauric acid, n-undecanoic acid or ascorbic acid, and an alkali, for example, a hydroxide of alkali metal or alkaline earth metal ammonia, ethanolamine, diethanolamine or triethanolamine. In addition, an organic acid, for example, a sulfonic acid, a sulfinic acid, an alkylsulfuric acid, a phosphonic acid, a phosphoric ester or the like, specifically, p-toluenesulfonic acid, dodecylbenzenesulfonic acid, p-toluenesulfinic acid, ethylic acid, phenylphosphonic acid, phenylphosphinic acid, phenyl phosphate or diphenyl phosphate can be used. The catalysts may be used individually or in combination of two or more thereof. The amount of the catalyst is preferably in a range of 0.001 to 10% by weight, more preferably in a range of 0.05 to 5% by weight, based on the metal compound as the raw material. When the amount of the catalyst is less than the above-described range, the initiation of the sol-gel reaction is delayed, whereas when it is more than the above-described range, the reaction rapidly proceeds to cause gelation soon in many oases, resulting in fear in that the coating operation can not be stably performed.

In order to initiate the sol-gel reaction, an appropriate amount of water is further necessary. The amount of water added is preferably from 0.05 to 50 molar times, more preferably from 0.5 to 30 molar times, based on the amount of water necessary for complete hydrolysis of the metal compound as the raw material. When the amount of water is less than the above-described range, the hydrolysis is difficult to proceed, whereas it is more than the above-described range, the hydrolysis is also difficult to proceed probably because of dilution of the raw material. To the sol-gel reaction solution is further added a solvent. As the solvent, any solvent which dissolves the metal compound as the raw material and dissolves or disperses sol-gel particles formed by the reaction can be used. For instance, a lower alcohol, for example, methanol, ethanol, propanol or butanol or a ketone, for example, acetone, methyl ethyl ketone or diethyl ketone is used. Further, for the purpose of improving the surface quality of the intermediate layer coated or the like, a mono- or di-alkyl ether or acetic ester of a glycol, for example, ethylene glycol, diethylene glycol, triethylene glycol, propylene glycol or dipropylene glycol may be used. Of the solvents, a lower alcohol which is miscible with water is preferable. Although the sol-gel reaction solution is prepared in concentration suitable for coating with the solvent, when the total amount of the solvent is added to the reaction solution from the beginning, the hydrolysis reaction is difficult to proceed probably because of dilution of the raw material.

Therefore, a method wherein a part of the solvent is added to the sol-gel reaction solution and the remainder of the solvent is added after the reaction proceeds is preferable.

The sol-gel reaction proceeds by mixing the raw material for the metal oxide, water, solvent and catalyst. The procedure of the reaction depends on the kinds and relative proportions of these components and the temperature and time of the reaction, and it effects on the film property of the layer formed. Since the effect of the reaction temperature is particularly large, it is preferred to control the temperature during the reaction. To the sol-gel reaction solution may be added a compound having a hydroxy group, an amino group or an active hydrogen in its molecule in addition to the above-described essential components in order to appropriately control the sol-gel reaction. Examples of the compound include polyethylene glycol, polypropylene glycol, a block copolymer thereof or a monoalkyl ether or monoalkylaryl ether thereof, various kinds of phenols, for example, phenol or cresol, polyvinyl alcohol or a copolymer thereof with other vinyl monomer, an acid having a hydroxy group, for example, malic acid or tartaric acid, an aliphatic or aromatic amine, formaldehyde and dimethylformaldehyde. Further, in order to increase compatibility of dried material of the coating solution with the organic solvent to solubilize, an organic polymer compound may be added.

The organic polymer compound (iii) includes, for example, polyvinyl chloride, polyvinyl alcohol, polyvinyl acetate, polyvinyl phenol, polyvinyl halogenated phenol, polyvinyl formal, polyvinyl acetal, polyvinyl butyral, polyamide, polyurethane, polyurea, polyimide, polycarbonate, an epoxy resin, phenol novolac, a condensation resin of resol phenol with aldehyde or ketone, polyvinylidene chloride, polystyrene, a silicone resin, an acrylic copolymer having an alkali-soluble group, for example, a phenolic hydroxy group, a sulfonamido group or a carboxyl group and a copolymer, terpolymer or higher order copolymer thereof. Particularly preferable compounds include a phenol novolac resin or resol resin, specifically, a novolac resin or resol resin of a phenol compound, for example, phenol, cresol (m-cresol, p-cresol, m/p mixed cresol), phenol/cresol (m-cresol, p-cresol, m/p mixed cresol), phenol-modified xylene, tert-butylphenol, octylphenol, resorcinol, pyrogallol, catechol, chlorophenol (m-Cl or p-Cl), bromophenol (m-Br or p-Br), salicylic acid or phloroglucinol with formaldehyde, and a condensation resin of the above phenol compound with acetone.

Other preferable examples of the polymer compound include copolymers including as the constituting unit a monomer represented by any one of (1) to (12) shown below.

(1) acrylamides, methacrylamides, acrylates and methacrylates each having an aromatic hydroxy group and hydroxy styrenes, for example, N-(4-hydroxyphenyl)acrylamide, N-(4-hydroxyphenyl)methacrylamide o-, m- or p-hydroxystyrene, or o-, m- or p-hydroxyphenylacrylate or methacrylate, (2) acrylates and methacrylates each having an aliphatic hydroxy group, for example, 2-hydroxyethyl acrylate or 2-hydroxyethyl methacrylate, (3) (substituted) acrylates, for example, methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate or N-dimethylaminoethyl acrylate, (3) (substituted) methacrylates, for example, methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate or N-dimethylaminoethyl methacrylate, (5) acrylamides and methacrylamides, for example, acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide or N-ethyl-phenylmethacrylamide, (6) vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether, (7) vinyl esters, for example, vinyl acetate, vinyl chloroacetate, vinyl buryrate or vinyl benzoate, (8) styrenes, for example, styrene, methylstyrene or chloromethylstyrene, (9) vinyl ketones, for example, methyl vinyl ketone, ethyl vinyl ketone, propyl vinyl ketone or phenyl vinyl ketone, (10) olefins, for example, ethylene, propylene, isobutylene, butadiene or isoprene,

(11) N-vinylpyrrolidone, N-vinylcarbazole, 4-vinylpyridine, acrylonitrile or methacrylonitrile, (12) acrylamides, for example, N-(o-aminosulfonylphenyl)acrylamide, N-(m-aminosulfonylphenyl)acrylamide, N-(p-aminosulfonylbenzyl)acrylamide, N-[1-(3-aminosulfonyl)naphthyl]acrylamide or N-(2-aminosulfonylethyl)acrylamide, methacrylamides, for example, N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide or N-(2-aminosulfonylethyl)methacrylamide, unsaturated sulfonamides of acrylates, for example, o-aminosulfonylphenyl acrylate, m-aminosulfonylphenyl acrylate, p-aminosulfonylphenyl acrylate or 1-(3-aminosulfonylphenylnaphthyl)acrylate, and unsaturated sulfonamides of methacrylates, for example, o-aminosulfonylphenyl methacrylate, m-aminosulfonylphenyl methacrylate, p-aminosulfonylphenyl methacrylate or 1-(3-aminosulfonylphenylnaphthyl) methacrylate.

The polymer compound preferably has a weight average molecular weight of 500 to 20,000 and a number average molecular weight of 200 to 60,000. The amount of the polymer compound added is suitably from 1 to 200% by weight, preferably from 2 to 100% by weight, particularly preferably from 5 to 50% by weight, based on the metal compound as the raw material. When the amount added is larger than the above range, the intrinsic hydrophilicity of the sol-gel degrades and the stain resistance in the printing decreases.

Further, in order to prevent dust-adhering failure due to peeling of scale-like dried material of the coating solution during the coating in the production and to obtain stable surface quality of the coating, it is preferred to add a plasticizer together with the organic polymer compound. Effective examples of the plasticizer for use in the intermediate layer according to the invention include dimethyl phthalate, diethyl phthalate, dibutyl phthalate, diheptyl phthalate, dioctyl phthalate, butyl benzyl phthalate, diisodecyl phthalate, ethyl phthalylethyl glycolate, methyl phthalylethyl glycolate, butyl phthalylbutyl glycolate, diisobutyl phthalate, octyl capryl phthalate, dicyclohexyl phthalate, ditridecyl phthalate, diallyl phthalate, dimethylglycol phthalate, ethyl phthalylethyl glycolate, methyl phthalylethyl glycolate, butyl phthalylbutyl glycolate, triethylene glycol caprylic acid diester, trioctyl trimellitate, dioctyl adipate, dioctyl azelate, dibutyl sebacate, dioctyl sebacate, methyl acetyl cinolate, dimethyl maleate, diethyl maleate, dibutyl maleate, dioctyl maleate, dibutyl fumalate, dioctyl fumalate, adipic acid-propylene glycol ester, adipic acid-1,3-butylene glycol ester, glycerol triacetate, glycerol tributyrate, cellulose acetate phthalate, trimethyl phosphate, triethyl phosphate, tributyl phosphate trioctyl phosphate, tributoxyethyl phosphate trischloroethyl phosphate, trisdichloropropyl phosphate, mono-2,3-dichloropropyl-bis-2,3-dibromopropyl phosphate, triphenyl phosphate, tricresyl phosphate, trixylenyl phosphate, cresyl diphenyl phosphate, diphenyl monoorthoxenyl phosphate, octyl diphenyl phosphate, triphenyl phosphate, trilauryl trithiophosphite, trischloroethyl phosphite, trilauryl phosphite, trisnonylphenyl phosphite, trisdinonylphenyl phosphite, dibutyl hydrogen phosphite, isopropyl acid phosphate, butyl acid phosphate, dibutyl phosphate, octyl acid phosphate, dioctyl phosphate, isodecyl acid phosphate, monoisodecyl phosphate and tridecanol acid phosphate. Among them, those having a boiling point of 250° C. or more at 760 mm Hg are particularly effective. Further, in order to avoid the degradation of stain resistance due to adhesion of an oleophilic substance at the time of plate-making, those as hydrophilic as possible are preferable. The plasticizer is added to the extent of preventing the intermediate layer from tackiness. The amount of the plasticizer added is suitably from 1 to 100% by weight, particularly preferably from 5 to 30% by weight, based on the metal compound as the raw material. When the amount added exceeds 100% by weight the hydrophilicity of the non-image area after development degrades and the stain resistance in the printing decreases.

To the intermediate layer may be added (ii) a colloidal silica sol for the purpose of preventing the degradation of hydrophilicity. As the colloidal silica sol, a colloidal solution of ultrafine particles of silic acid using as a dispersion medium, for example, water, methanol, ethanol, isopropyl alcohol, butanol, xylene or dimethylformamide is exemplified. Methanol is particularly preferable as the dispersion medium. The particle size of the dispersoid is preferably from 1 to 100 µm, and particularly preferably from 10 to 50 µm. When the particle size exceeds 100 µm, the uniformity of the layer coated degrades because of roughness of the surface.

The content of the silic acid is preferably form 5 to 80% by weight. The silic acid having hydrogen ion concentration without a neutral region (pH of 6 to 8) is preferable in view of the stability. Particularly, the silic acid having the hydrogen ion concentration in an acidic region is preferable.

The silica sot is possible to use together with other fine particles, for example, alumina sol or lithium silicate. By using such other fine particles, the curing property of the sol-gel coating is further improved. The amount of the colloidal silica sol added is preferably from 30 to 300% by weight, more preferably from 30 to 200% by weight, most preferably from 50 to 100% by weight, based on the metal compound as the raw material. When the amount added is more than the above range, the film-forming property degrades and it is difficult to coat uniformly. When the amount added is less than the above range, the effect of preventing the degradation of hydrophilicity is not achieved.

Further, to the intermediate layer may be added a surfactant for the purpose of improving surface state of the coating.

Moreover, to the intermediate layer may be added as a lubricant, for example, a higher fatty acid or higher fatty acid amide, for example, behenic acid, behenic acid amide, stearic acid, stearic acid amide or alkenylsuccinic acid anhydride, wax, dimethylsiloxane or polyethylene powder.

The coating amount of the intermediate layer is preferably in a range of 2 to 1,000 mg/m², more preferably in a range of 5 to 200 mg/m², and most preferably in a range of 10 to 50 mg/m². In order to coat the intermediate layer on the support, various methods can be utilized and a method of making a coating solution, coating the solution and drying is most preferable in view of ensuring the above-described coating amount.

[Photosensitive Layer]

<Sensitizing Dye>

The sensitizing dye for use in the photopolymerization type photosensitive lithographic printing plate precursor according to the invention is a sensitizing dye having an absorption maximum in a wavelength range of 360 to 450 nm. Examples of the sensitizing dye include merocyanine dyes represented by formula (4) shown below, benzopyranes or coumarins represented by formula (5) shown below, aromatic ketones represented by formula (6) shown below, and anthracenes represented by formula (7) shown below.

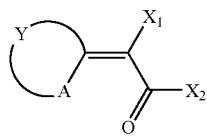
(4)

In formula (4), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

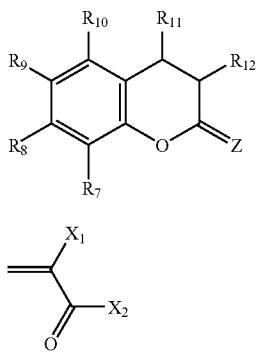

In formula (1'), =Z represents an oxo group, a thioxo group, an imino group or an alkylydene group represented by the partial structural formula (1') described above, $X_1$ and $X_2$ have the same meanings as defined in formula (4) respectively, and $R_7$ to $R_{12}$ each independently represents a monovalent non-metallic atomic group.

In formula (6), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

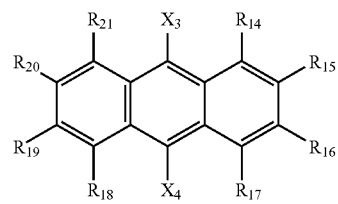

In formula (7), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (4) to (7), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, a acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-akylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, a N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (4) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (fox example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2] dithiol or naphtho[2,1]dithiol); and dithiols (for example, 4,5-dimethyldithiol, 4-phenyldithiol, 4-methoxycarbonyldithiol, 4,5-dimethoxycarbonyldithol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-(3H)-benzothiazolylidene group.

Of the sensitizing dyes having an absorption maximum in a wavelength range of 360 to 450 nm, dyes represented by formula (8) shown below are more preferable in view of high sensitivity.

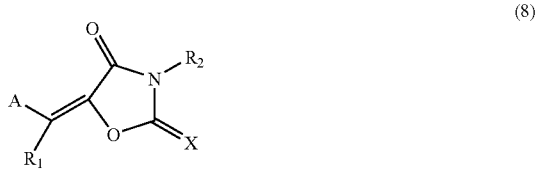

(8)

In formula (8), A represents an aromatic cyclic group which may have a substituent or a heterocyclic group which may have a substituent, X represents an oxygen atom, a sulfur atom or $NR_3$, and $R_1$, $R_2$ and $R_3$ each independently represents a hydrogen atom or a monovalent non-metallic atomic group, or A and $R_1$ or $R_2$ and $R_3$ may be combined with each other to form an aliphatic or aromatic ring.

The formula (8) will be described in more detail below. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkycarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO₃H₂) and its conjugated base group (hereinafter referred to as a "phosphonato group"), a dialkylphosphono group (—PO₃(alkyl)₂), a diarylphosphono group (—PO₃(aryl)₂), an alkylarylphosphono group (—PO₃(alkyl)(aryl)), a monoalkylphosphono group (—PO₃H(alkyl)) and its conjugated base group (hereinafter referred to as an "alkylphosphonato group"), a monoarylphosphono group (—PO₃H(aryl)) and its conjugated base group (hereinafter referred to as an "arylphosphonato group"), a phosphonooxy group (—OPO₃H₂) and its conjugated base group (hereinafter referred to as a "phosphonatooxy group") a dialkylphosphonooxy group (—OPO₃(alkyl)₂), a diarylphosphonooxy group (—OPO₃(aryl)₂), an alkylarylphosphonooxy group (—OPO₃(alkyl)(aryl)), a monoalkylphosphonooxy group (—OPO₃H(alkyl)) and its conjugated base group (hereinafter referred to as an "alkylphosphonatooxy group"), a monoarylphosphonooxy group (—OPO₃H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group represented by any one of R₁, R₂, and R₃ preferably include a monocyclic or polycyclic aromatic cyclic group containing at least one of a nitrogen atom, an oxygen atom and a sulfur atom. Examples of especially preferable heteroaryl group include a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group represented by any one of R₁, R₂ and R₃ preferably include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of G₁ in the acyl group (G₁CO—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight cha alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of R₁, R₂ and R₃, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of R₁, R₂ and R₃ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-totylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolyphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Preferable examples of the substituted or unsubstituted alkenyl group and the substituted or unsubstituted aromatic heterocyclic residue represented by any one of $R_1$, $R_2$ and $R_3$ include those described with respect to the alkenyl group and heteroaryl group above.

Next, A in formula (8) will be described below. A represents an aromatic cyclic group which may have a substituent or heterocyclic group which may have a substituent. Specific examples of the aromatic cyclic group which may have a substituent or heterocyclic group which may have a substituent include those described for any one of $R_1$, $R_2$ and $R_3$ in formula (8).

The sensitizing dye represented by formula (8) according to the invention is obtained by a condensation reaction of the above-described acidic nucleus or an active methyl group-containing acidic nucleus with a substituted or unsubstituted, aromatic ring or hetero ring and can be synthesized with reference to JP-B-59-28329.

Preferable specific examples (D1) to (D42) of the compound represented by formula (8) are set forth below. Further, when isomers with respect to a double bond connecting an acidic nucleus and a basic nucleus are present in each of the compounds, the invention should not be construed as being limited to any one of the isomers.

(D1)

(D2)

(D3)

(D4)

(D5)

(D6)

(D7)

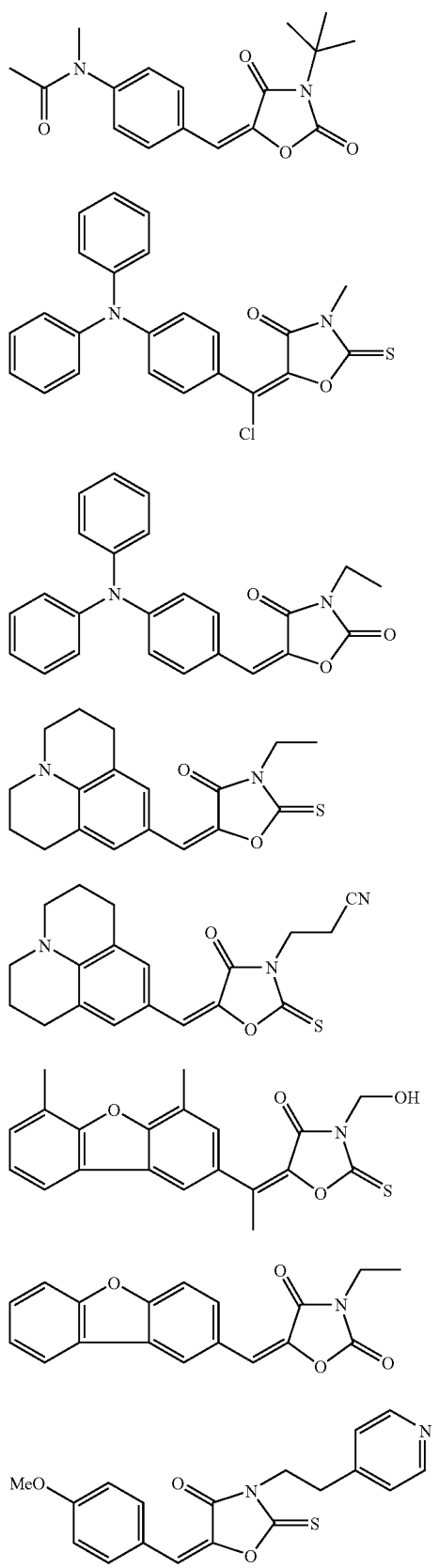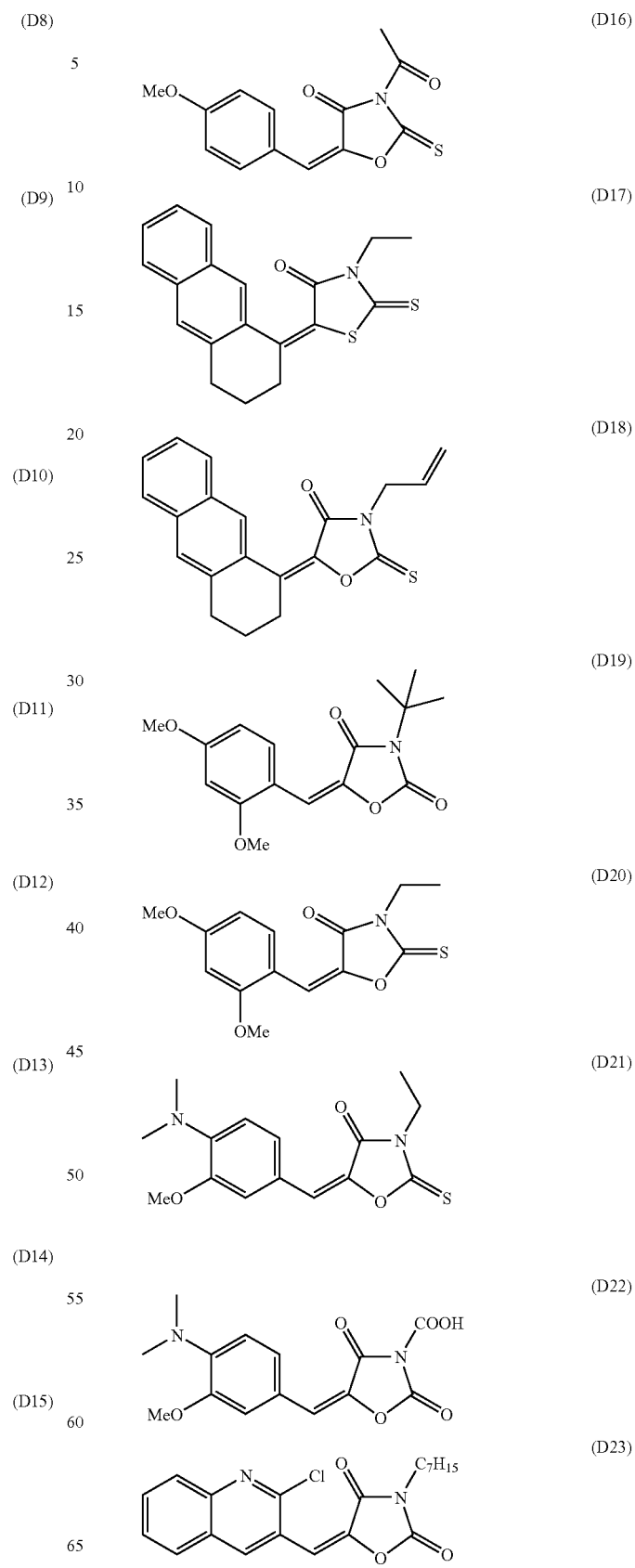

-continued
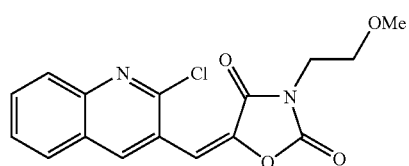
(D24)
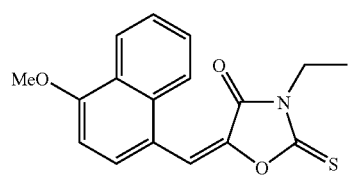
(D25)
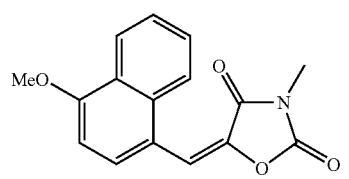
(D26)
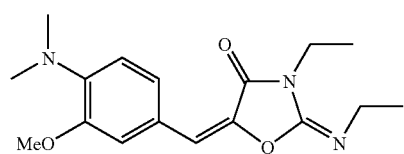
(D27)
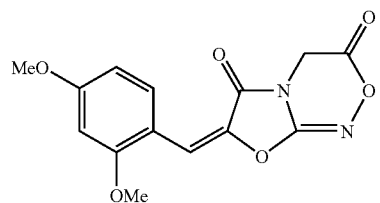
(D28)
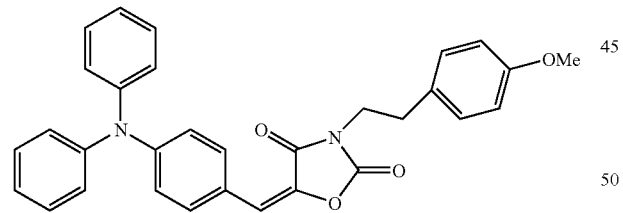
(D29)
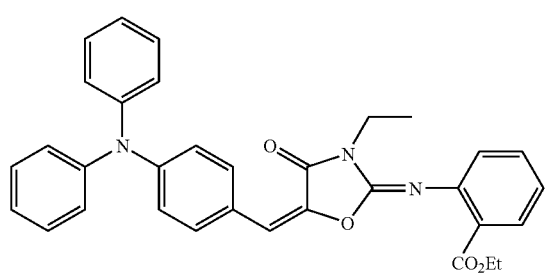
(D30)
-continued
(D31)
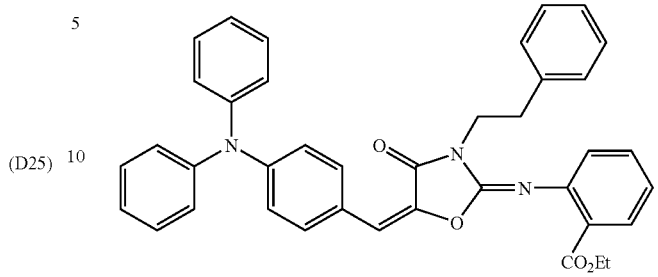
(D32)
(D33)
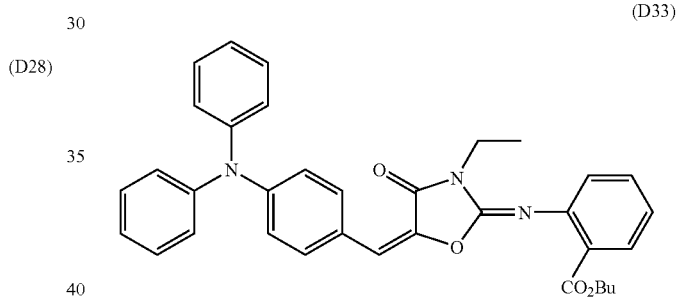
(D34)
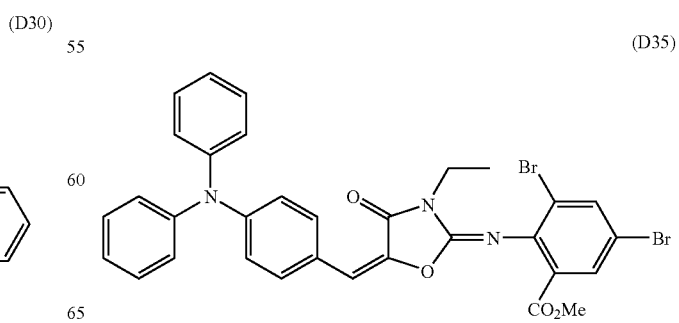
(D35)

-continued (D36)
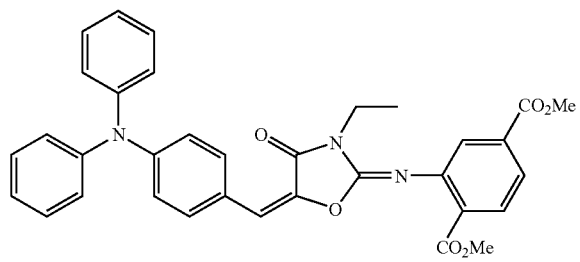

(D37)
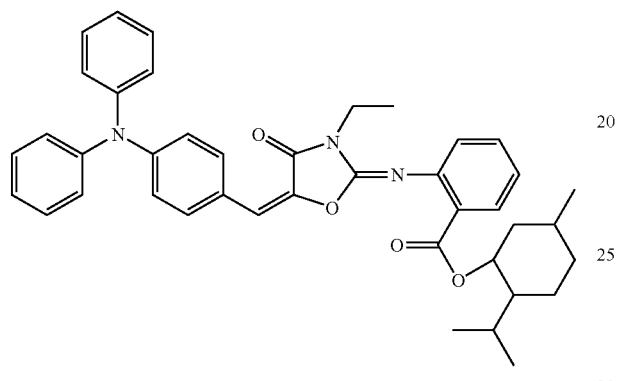

(D38)
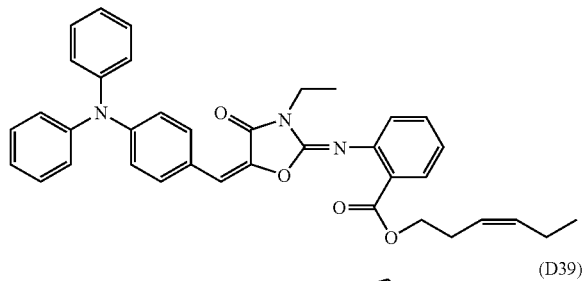

(D39)
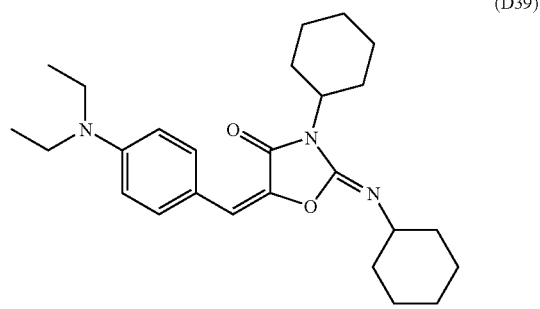

(D40)
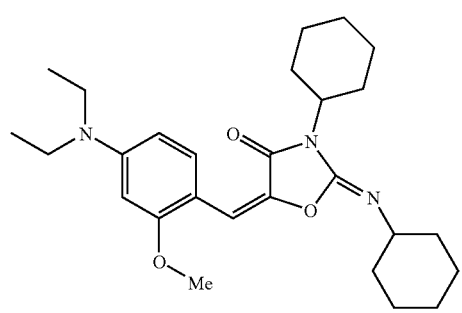

-continued (D41)
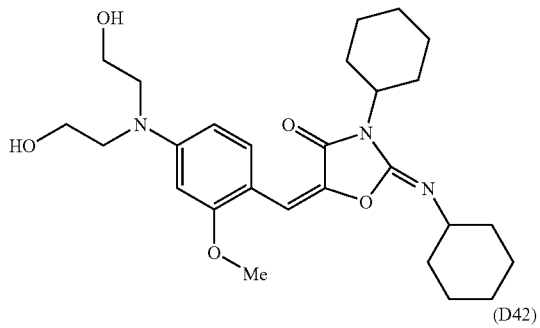

(D42)

Since the sensitizing dyes have absorption coefficients different from each other depending on the structures thereof, the amount added varies according to the structure of the sensitizing dye to be used. The optimal amount thereof is an amount in that absorbance of the photosensitive layer including the sensitizing dye at the laser emission wavelength is 0.6 or less, preferably in a range of 0.05 to 0.55, more preferably in a range of 0.1 to 0.50, and still more preferably in a range of 0.15 to 0.45.

<Photopolymerization Initiator>

Now, the photopolymerization initiator which is incorporated into the photosensitive layer for use in the invention is described below. The photopolymerization initiator incorporated into the photosensitive layer for use in the invention includes a hexaarylbiimidazole compound. As the hexaarylbiimidazole compound, various compounds described, for example, in EP-A-24,629, EP-A-107,792, U.S. Pat. No. 4,410,621, EP-A-215,453 and GP-A-3,211,312 can be used.

Preferable examples of the hexaarylbiimidazole compound include 2,4,5,2',4',5'-hexaphenylbisimidazole, 2,2'-bis(2-chlorophenyl)-4,5,4',5'-tetraphenylbisimidazole, 2,2-bis(2-bromophenyl)-4,5,4',5'-tetraphenylbisimidazole, 2,2'-bis(2,4-dichlorophenyl)-4,4',5,5'-tetraphenylbisimidazole, 2,2'-bis(2-chlorophenyl)-4,5,4',5'-tetrakis(3-methoxyphenyl) bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis(2-nitrophenyl)-4,5,4',5'-tetraphenylbisimidazole, 2,2-di-o-tolyl-4,5,4',5'-tetraphenylbisimidazole, 2,2'-bis(2-ethoxyphenyl)-4,5,4',5'-tetraphenylbisimidazole and 2,2'-bis(2,6-difluorophenyl)-4,5,4',5'-tetraphenylbisimidazole.

The hexaarylbiimidazole compounds may be used as a mixture of two or more thereof.

The amount of the hexaarylbiimidazole compound used is ordinarily in a range from 0.05 to 50 parts by weight, preferably from 0.2 to 30 parts by weight, based on 100 parts by weight of the total amount of the addition polymerizable compound having an ethylenically unsaturated double bond.

Other known photopolymerization initiator may be used together with the hexaarylbiimidazole compound. The other photopolymerization initiator used together is not particularly restricted and includes, for example, benzyl, benzoyl ether, Michler's ketone, anthraquinone, thioxantone, acridine, phenazine, benzophenone and titanocene compound.

Further, various photopolymerization initiation systems have also been proposed and, for instance, a certain kind of photo-reducing dyes, Rose Bengal, Eosin or erythrosine as described in U.S. Pat. No. 2,850,445, and a combination system comprising a dye and an initiator, for example, a composite initiator system comprising a dye and an amine as described in JP-B-44-20189, a combination system of a hexaarylbiimidazole, a radical generator and a dye as described in JP-B-45-37377, a combination system of a hexaarylbiimidazole and a p-dialkylaminobenzylidene ketone as described in JP-B-47-2528 and JP-A-54-155292, a combination system of a cyclic cis-α-dicarbonyl compound and a dye as described in JP-A-48-84183, a combination system of a cyclic triazine and a merocyanine dye as described in JP-A-54-151024, a combination system of a 3-ketocoumarin and an activator as described in JP-A-52-112681 and JP-A-58-15503, a combination system of a biimidazole, a styrene derivative and a thiol as described in JP-A-59-140203, a combination system of an organic peroxide and a dye as described in JP-A-59-1504, JP-A-59-140203, JP-A-59-189340, JP-A-62-174203, JP-B-62-1641 and U.S. Pat. No. 4,766,055, a combination system of a dye and a active halogen compound as described in JP-A-63-258903 and JP-A-2-63054, a combination system of a dye and a borate compound as described in JP-62-143044, JP-A-62-150242, JP-A-64-13140, JP-A-64-13141, JP-64-13142, JP-A-64-13143, JP-A-64-13144, JP-A-64-17048, JP-A-1-229003, JP-A-1-298348 and JP-A-1-138204, a combination system of a dye having a rhodanine ring and a radical generator as described in JP-A-2-179643 and JP-A-2244050, a combination system of a titanocene and a 3-ketocoumarin dye as described in JP-A-63-221110, a combination system of a titanocene, a xanthene dye and an addition-polymerizable ethylenically unsaturated bond-containing compound having an amino group or a urethane group as described in JP-A-4-221958 and JP-A-4-219756, a combination system of a titanocene and a specific merocyanine dye as described in JP-A-6-295061, and a combination system of a titanocene and a dye having a benzopyran ring as described in JP-A-8-334897 are possible to use together.

The amount of other initiator (initiation system) added is ordinarily from 0 to 100 parts by weight, preferably from 0 to 70 parts by weight, more preferably from 0 to 50 parts by weight, per 100 parts by weight of the hexaarylbiimidazole compound.

It is also known that the photo-initiation ability is moreover enhanced by adding to the above-described photopolymerization initiator, a hydrogen donating compound, for example, a thiol compound (e.g., 2-mercaptobenzothiazole, 2-mercaptobenzimidazole or 2-mercaptobenzoxazole) or an amine compound (e.g., N-phenylglycine or N,N-dialkylamino aromatic alkyl ester), if desired. As the hydrogen donating compound having a particularly high photo-initiation ability suitable for the invention, a mercapto group-containing compound is exemplified.

More preferable examples of the hydrogen donating compound include mercapto group-containing heterocyclic compounds having the structure represented by formula (2) or (3) shown below. In formulae (2) and (3), the structures of tautomers are indicated respectively.

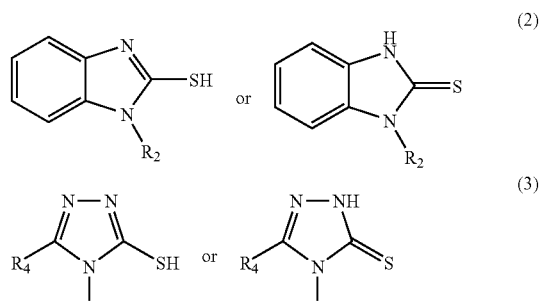

In formulae (2) and (3), $R_2$, $R_3$ and $R_4$ each independently represents a hydrogen atom, a straight-chain or branched alkyl group having from 1 to 18 carbon atoms which may have a substituent a cyclic alkyl group having from 5 to 20 carbon atoms which may have a substituent or an aromatic group which may have a substituent. Examples of the substituent include a halogen atom, a hydroxy group, an amino group, a thiol group, an acetyl group and a carboxyl group.

Specific preferable examples (SH1) to (SH20) of the compound represented by formula (2) or (3) are set forth below, but the invention should not be construed as being limited thereto. The structures shown below are indicated by the —SH group-containing structure of the tautomers.

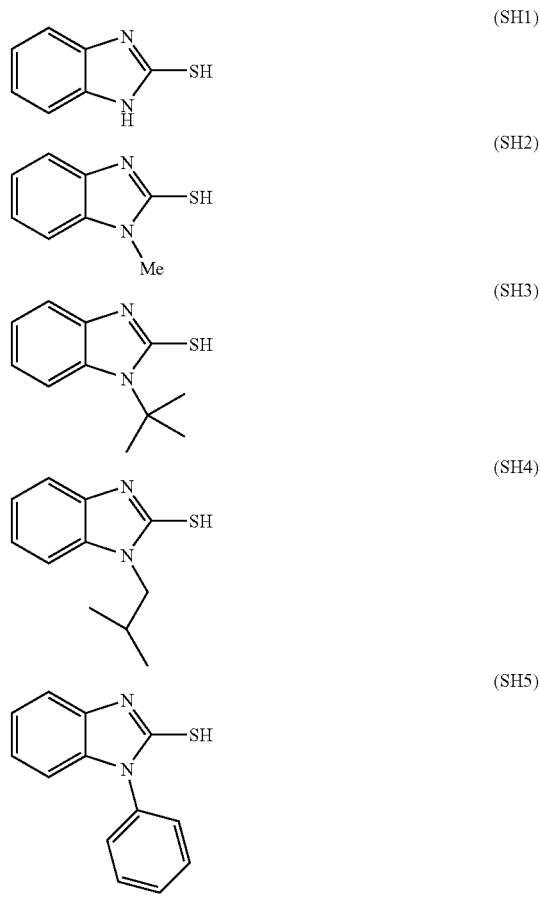

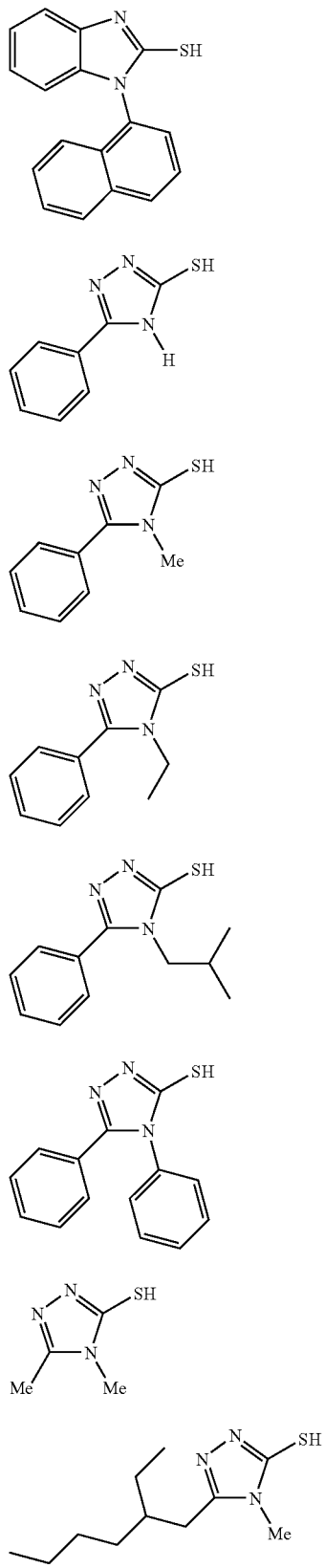
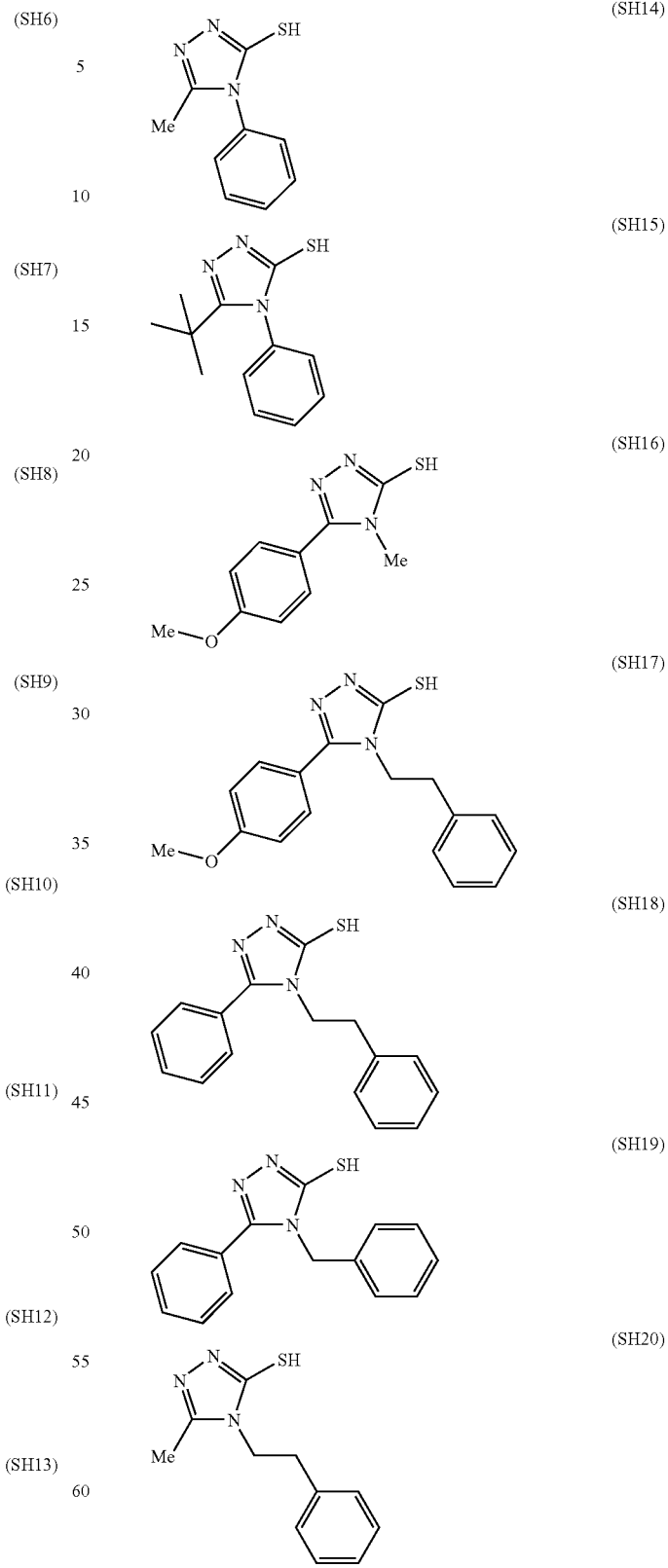
The mercapto group-containing heterocylic compound is used preferably at a ratio of 0.2 to 10.0 moles, per mole of the hexaarylbiimidazole compound added. The ratio is more preferably from 0.5 to 6.0 moles, and most preferably from 0.5 to 4.0 moles, per mole of the hexaarylbiimidazole compound added.

<Addition Polymerizable Compound Having an Ethylenically Unsaturated Double Bond>

The addition polymerizable compound having an ethylenically unsaturated double bond incorporated into the photosensitive layer for use in the invention can be appropriately selected from compounds having at least one, preferably two or more ethylenically unsaturated double bond groups.

The compound has a chemical form, for example, a monomer, a prepolymer (i.e., a dimmer, trimer or oligomer) or a mixture thereof or a polymer.

Examples of the monomer or the like include esters between an unsaturated carboxylic acid (for example, acrylic acid methacrylic acid, itaconic acid, crotonic acid, isocrotonic acid or maleic acid) and an aliphatic polyhydric alcohol compound and amides between an unsaturated carboxylic acid and an aliphatic polyvalent amine compound.

Specific examples of the monomer of the ester between an aliphatic polyhydric alcohol compound and an unsaturated carboxylic acid include:

acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythirtol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer;

methacrylates, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerytritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane or bis-[p-(methacryloxyethoxy)phenyl]dimethylmethane;

itaconates, for example, ethylene glydcol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonatates, for example, ethylene glycol dicrotonate, tetramethylene glycol dicrotonate, pentaerythritol dicrotonate or sorbitol tetradicrotonate;

isocrotonates, for example, ethylene glycol diisocrotonate, pentaerythrtol diisocrotonate or sorbitol tetraisocrotonate;

and maleates, for example, ethylene glycol dimaleate, triethylene glycol dimaleate, pentaerythritol dimaleate or sorbitol tetramaleate.

Further, mixtures of the ester monomers are exemplified.

Also, specific examples of the monomer of the amide between an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Also, urethane acrylates as described in JP-A-51-37193, polyester acrylates as described in JP-A-48-64183, JP-B-49-43191 and JP-B-52-30490, and polyfunctional acrylates or methacrylates, for example, epoxyacrylates obtained by reacting an epoxy resin with (meth)acrylic acid an exemplified. Further, photo-curable monomers and oligomers described in *Nippon Secchaku Kyokaishi* (*Journal of Japan Adhesion Society*), Vol. 20, No. 7, pages 300 to 308 (1984) can also be used.

Specifically, NK OLIGO U-4HA, NK OLIGO U-4H, NK OLIGO U-6HA, NK OLIGO U-6ELH, NK OLIGO U-108A, NK OLIGO U-1084A, NK OLIGO U-200AX, NK OLIGO U-122A, NK OLIGO U-340A, NK OLIGO UA-324A and NK OLIGO UA-100 (all of which are produced by Shin-Nakamura Chemical Co., Ltd.); UA-306H AI-600, UA-101T, UA-101I, UA-306T and UA-306I (all of which are produced by Kyoeisha Chemical Co., Ltd.); ART RESIN UN-9200A, ART RESIN UN-3320HA, ART RESIN UN-3320HB, ART RESIN UN-3320HC, ART RESIN-380G, ART RESIN SH-500 and ART RESIN SH-9832 (all of which are produced by Negami Chemical Industrial Co., Ltd.); and PLEX 6661-O (produced by Degussa AG, Germany) are exemplified.

The amount of the addition polymerizable compound having an ethylenically unsaturated double bond used is preferably in a range of 5 to 90% by weight, more preferably in a range of 20 to 75% by weight, based on the total components of the photosensitive layer.

[Binder Polymer]

In the invention, the photosensitive layer contains a binder polymer.

The binder polymer not only functions as a film-forming agent of the photosensitive layer but also is required to be dissolved in an alkali developer so that an organic polymer soluble or swellable in alkali water can be used. Specifically, by using the polymer soluble or swellable in alkali water, the binder polymer can be removed with alkali development and if desired, by adding a pressure, for example, with a brush.

The binder polymer preferably used in the invention is a polymer having at least all of three kinds of structural units represented by the following formulae (1) to (3):

(1)

(2)

(3)

In the formulae, $R_1$ and $R_2$ each independently represents a hydrogen atom or an alkyl group having from 1 to 6 carbon atoms, $R_3$ represents a hydrogen atom, an alkyl group having from 1 to 6 carbon atoms or a substituted alkyl group having from 1 to 6 carbon atoms which is substituted with a hydroxy group, a halogen atom, an amino group, a methoxy group or a carboxyl group; X represents a functional group selected from —COOH, —CO—$W_1$-$L_1$-COOH and —SO$_3$H, $W_1$ represents an oxygen atom, a sulfur atom or a —NH— group, $L_1$ represents a divalent organic group, Y represents —CO—O—CH$_2$—CH═CH$_2$ group or a —CO—$W_2$-$L_2$—O—CO—CR$_4$═CH$_2$ group, $W_2$ represents an oxygen atom, a sulfur atom or a —NH— group, $L_2$ represents a divalent organic group, $R_4$ represents a hydrogen atom or an alkyl group having from 1 to 6 carbon atoms, $W_3$ represents an oxygen atom, a sulfur atom or an —NH group, and $R_5$ represents an alkyl group having from 1 to 18 carbon atoms, an alkyl group containing an alicyclic structure having from 5 to 20 carbon atoms or a group containing an aromatic ring having from 6 to 20 carbon atoms.

Specific examples of the structural unit represented by formulae (1) to (3) are set forth below, but the invention should not be construed as being limited thereto.

Specific examples of the repeating unit represented by formula (1) include the structures shown below.

1-1
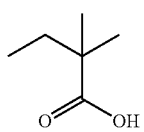

1-2
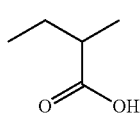

1-3
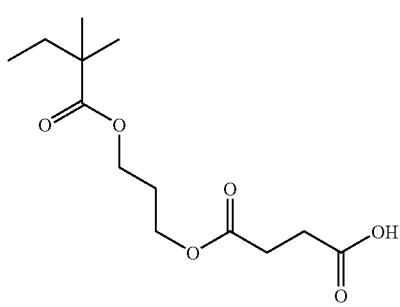

1-4
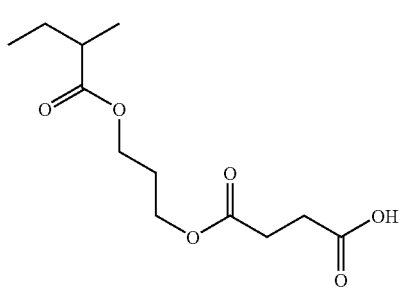

-continued 1-5
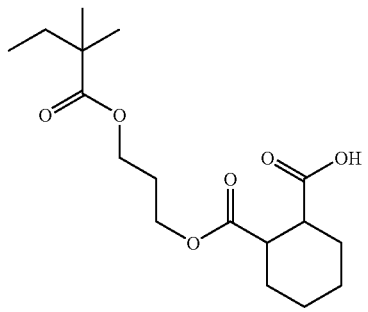

1-6
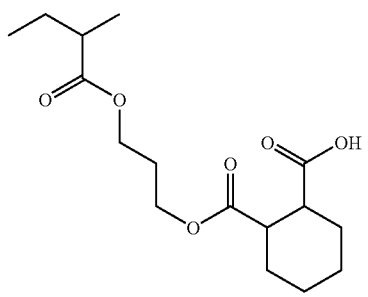

1-7
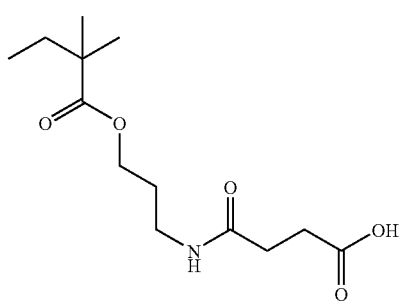

1-8
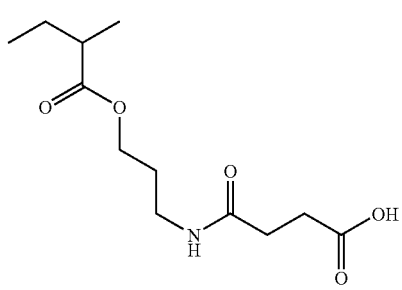

1-9
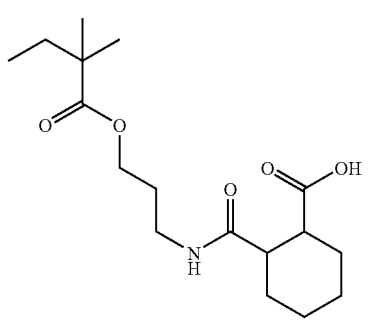

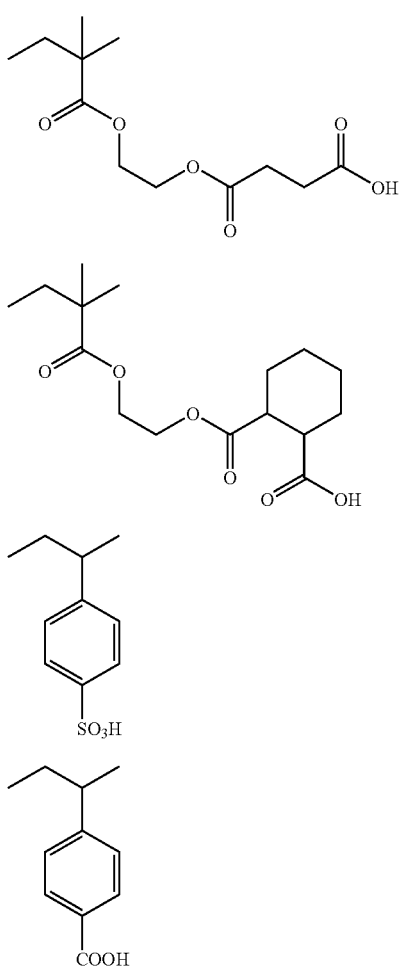

Specific examples of the repeating unit represented by formula (2) include the structures shown below.

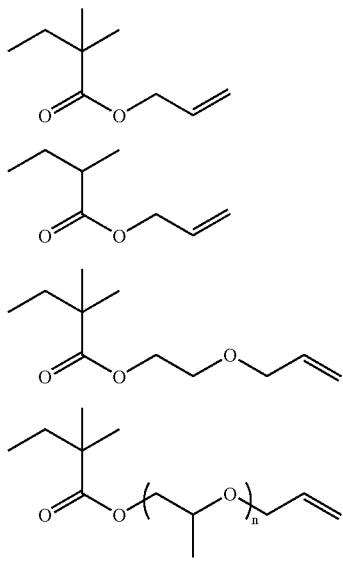

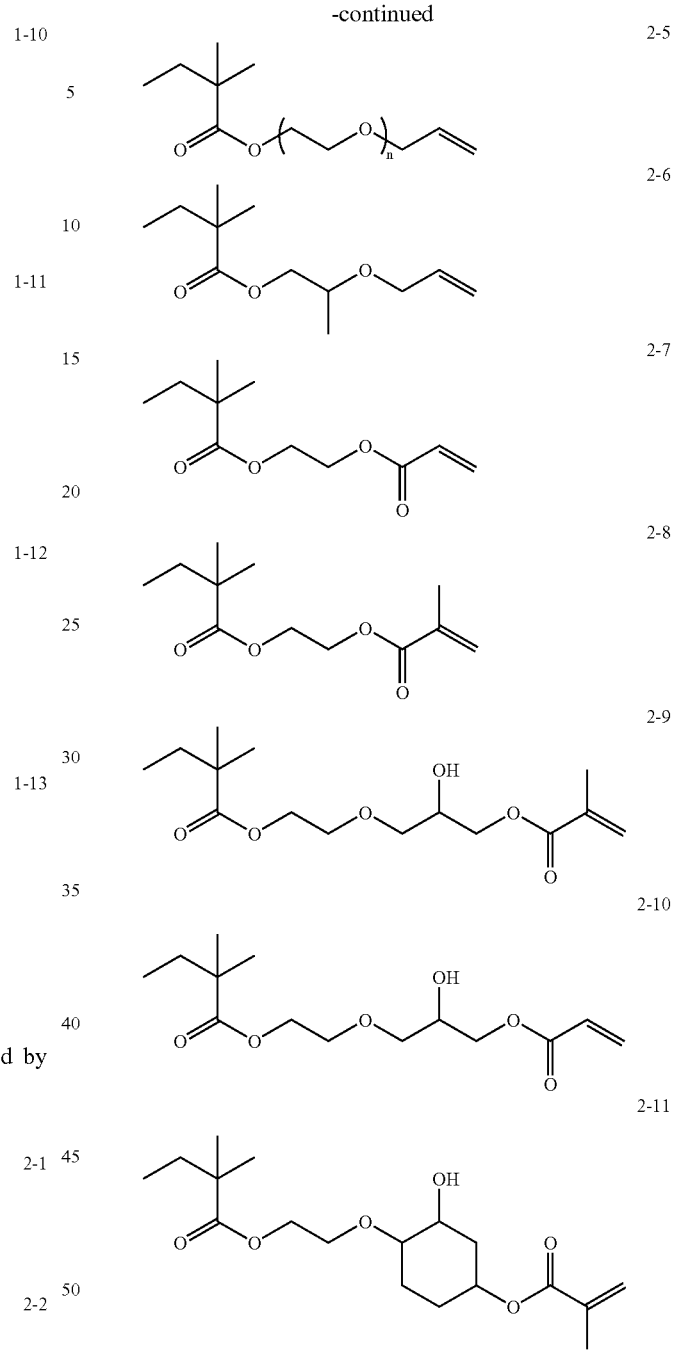

Specific examples of the repeating unit represented by formula (3) include alkyl or aryl (meth)acrylates, for example, methyl (meth)acrylate, ethyl (meth)acrylate, isobutyl (meth)acrylate, n-butyl (meth)acrylate, isopropyl (meth)acrylate, cyclohexyl (meth)acrylate, n-hexyl (meth)acrylate, adamantyl (meth)acrylate, benzyl (meth)acrylate or phenethyl (meth)acrylate and (meth)acrylates represented by the formulae shown below.

In the formulae shown below, R preferably represents a methyl group, an ethyl group, an isopropyl group, a n-butyl group, a tert-butyl groups a cyclohexyl group, a phenethyl group, a benzyl group or a n-hexyl group.

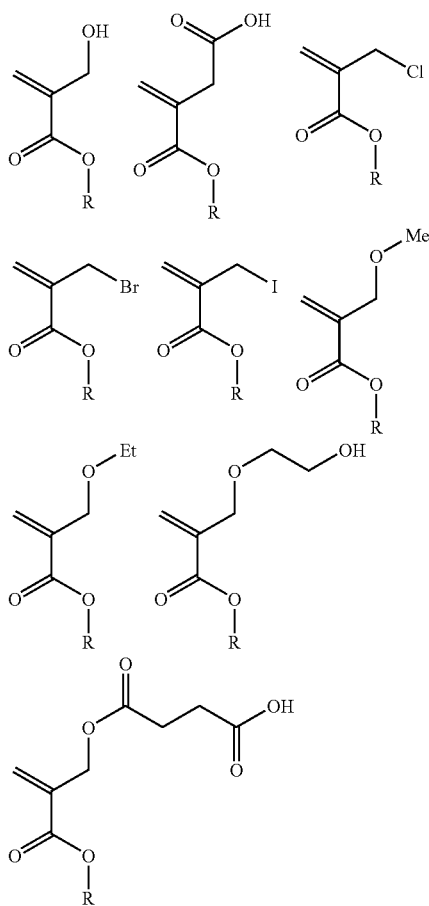

In order to ensure developing property of the photosensitive layer, it is preferred that the binder polymer used has an adequate molecular weight and acid value. The binder polymer having a weight average molecular weight of 5,000 to 300,000 and an acid value of 0.5 to 200 is especially preferable. The term "acid value" of the binder polymer as used herein mans the number of mg of potassium hydroxide necessary for neutralizing free fatty acids contained in one g of the binder polymer. The acid value of the binder polymer is more preferably from 5.0 to 180, and particularly preferably from 10 to 150.

Further, the weight ratio of the total amount of the structural unit represented by formula (1) and the structural unit represented by formula (3) to the structural unit having an ethylenically unsaturated double bond represented by formula (2) is preferably in a range of 0.1 to 3.0, more preferably in a range of 0.1 to 2.0, and most preferably in a range of 0.1 to 1.0.

Any mixing ratio of the structural units represented by formulae (1), (2) and (3) may be used as long as the above-described molecular weight, acid value and amount of double bond included are satisfied. Also, as long as the above-described molecular weight, acid value and amount of double bond included are satisfied, a structural unit other than the structural units represented by formulae (1), (2) and (3) may further be added.

The binder polymer can be incorporated in an appropriate amount into the photosensitive layer. The amount of the binder polymer is ordinarily 90% by weight or less of the photosensitive layer in view of the strength of image formed or the like. It is preferably from 10 to 90% by weight, and more preferably from 30 to 80% by weight, of the photosensitive layer.

In the invention, a polymer soluble or swellable in alkali water other than the binder polymer described above can be used, and also the binder polymer described above can be used in mixture with the other polymer.

As the other polymer soluble or swellable in alkali water, various kinds of organic polymers are exemplified. When it is desired to perform water development, for example, a water-soluble organic polymer is used. Examples of such an organic polymer include addition polymers having a carboxylic acid group in the side chain thereof, for example, polymers described in JP-A-59-44615, JP-B-54-34327, JP-B-58-12577, JP-B-54-25957, JP-A-54-92723, JP-A-59-53836 and JP-A-59-71048, more specifically, methacrylic acid copolymers, acrylic acid copolymers, itaconic acid copolymers, crotonic acid copolymers, maleic acid copolymers and partially esterified maleic acid copolymers, acidic cellulose derivatives having a carboxylic acid group in the side chain thereof, polymers obtained by adding a cyclic acid anhydride to an addition polymer having a hydroxy group, polyvinyl pyrrolidone, polyethylene oxide, and alcohol-soluble polyamides and polyethers of 2,2-bis-(4-hydroxyphenyl)propane with epichlorohydrin capable of increasing strength of the cured layer.

Moreover, polyurethane resins described in JP-B-7-120040, JP-B-7-120041, JP-B-7-120042, JP-B-8-12424, JP-A-63-287944, JP-A-63-287947, JP-A-1-271741 and JP-A-11-352691 are also used in the invention.

In order to ensure developing property of the photosensitive layer, it is preferred that the binder polymer used has an adequate molecular weight and acid value. The binder polymer having a weight average molecular weight of 5,000 to 300,000 and an acid value of 20 to 200 is especially preferable.

<Other Components of Photosensitive Layer>

It is desirable to add a small amount of a thermal polymerization inhibitor to the photosensitive layer for use in the invention in addition to the above-described basic components in order to prevent the addition polymerizable compound having an ethylenically unsaturated double bond from undergoing undesirable thermal polymerization during the production or preservation of the composition (photopolymerization type photosensitive composition) for forming the photosensitive layer. Examples of suitable thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-tert-butylphenol), N-nitrosophenylhydroxyamine cerium(III) salt and N-nitrosophenylhydroxyamine aluminum salt. The amount of the thermal polymerization inhibitor added is preferably from about 0.01 to about 5% by weight based on the total components of the composition. If desired, in order to prevent polymerization inhibition due to oxygen, a higher fatty acid derivative, for example, behenic acid or behenic acid amide may be added and allowed to local on the surface of the photopolymerizable photosensitive layer during a drying step after the coating. The amount of the higher fatty acid derivative added is preferably from about 0.5 to about 10% by weight based on the total components of the photopolymerization type photosensitive composition.

Further, a coloring agent may be added for the purpose of coloring the photosensitive layer. The coloring agent includes pigments, for example, phthalocyanine-base pigment (e.g., C.I. Pigment Blue 15:3, C.I. Pigment Blue 15:4 or C.I. Pigment Blue 15:6), azo-base pigment, carbon black and titanium oxide, and dyes, for example, Ethyl Violet, Crystal Violet, azo dye, antraquinone-base dye and cyanine-base dye. The amount of the coloring agent added is preferably from about 0.5 to about 5% by weight based on the total components of the photopolymerization type photosensitive composition.

Moreover, in order to improve physical properties of the cured layer, an additive, for example, inorganic filler or a plasticizer, e.g., dioctyl phthalate, dimethyl phthalate or tricresyl phosphate. The amount of the additive is preferably 10% by weight or less based on the total components of the photopolymerization type photosensitive composition.

Furthermore, to the composition for forming the photosensitive layer can be added a surfactant for improving surface quality of the coating. Preferable examples of the surfactant include a fluorine-based nonionic surfactant.

<Formation of Photosensitive Layer>

According to the invention, the photopolymerization type photosensitive composition is provided on the support which is subjected to various surface treatments described in detail hereinbefore, if desired. In the case of providing the photopolymerization type photosensitive composition on the support, the photosensitive composition can be used after dissolving it in various organic solvents. Examples of the solvent capable of being used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or as a mixture thereof. The concentration of solid content in the coating solution is appropriately from 1 to 50% by weight.

The coating amount of the photosensitive layer of the photopolymerization type photosensitive lithographic printing plate precursor is preferably in a range of about 0.1 to about 10 g/m$^2$, more preferably in a range of 0.3 to 5 g/m$^2$, and still more preferably in a range of 0.5 to 3 g/m$^2$, in terms of weight after drying.

[Protective Layer]

The photopolymerization type photosensitive lithographic printing plate precursor according to the invention has a protective layer on the photosensitive layer.

The protective layer for use in the invention is characterized by having oxygen permeability (A) at 25° C. under one atmosphere of $25 \leq (A) \leq 200$ (ml/m$^2$·day). When the oxygen permeability (A) is less than 25 (ml/m$^2$·day), not only deterioration of developing property due to the polymerization in the dark is apt to occur so that the preservation stability decreases, but also the uniformity of halftone dot in the halftone area formed using an FM screen becomes poor and the reproducibility in a shadow area degrades. On the contrary, when the oxygen permeability (A) exceeds 200 (ml/m$^2$·day), the decrease in sensitivity according to the polymerization inhibition due to oxygen is apt to occur.

For these reasons, the protective layer according to the invention is needed to have the oxygen permeability (A) at 25° C. under one atmosphere of $25 \leq (A) \leq 200$ (ml/m$^2$·day). The oxygen permeability (A) is preferably in a range of $30 \leq (A) \leq 175$ (ml/m$^2$·day), and more preferably in a range of $35 \leq (A) \leq 150$ (ml/m$^2$·day). The oxygen permeability can be adjusted for example, by varying the addition amount of polyvinyl alcohol or polyvinyl pyrrolidone or by addition of a surfactant, as describe below.

Besides the above described oxygen permeability, the characteristics required of the protective layer is that it does not substantially hinder the transmission of laser light and it can be easily removed during a development step after the exposure. Contrivances on the protective layer have been heretofore made and described in detail in U.S. Pat. No. 3,458,311 and JP-B-55-49729.

The material for use in the protective layer according to the invention is not particularly restricted as long as the condition of the oxygen permeability described above is fulfilled and includes, for example, polyvinyl alcohol. Preferably, it is a mixture of polyvinyl alcohol having a saponification degree of 95% by mole or more and a water-soluble resin having oxygen permeability higher than oxygen permeability of the polyvinyl alcohol in a mixing ratio by weight of 9:1 to 1:9. More preferably, the water-soluble resin is at least one member selected from a vinyl pyrrolidone/vinyl imidazole copolymer, a vinyl pyrrolidone/vinyl caprolactam copolymer and an anion-modified polyvinyl alcohol. The mixing ratio by weight of the polyvinyl alcohol and the water-soluble resin (the former:the latter) is preferably from 8.5:1.5 to 1.5:8.5, and more preferably from 8:2 to 5:5.

The polyvinyl alcohol for use in the protective layer may be partially substituted with an ester, ether or acetal as long as it has unsubstituted vinyl alcohol units necessary for providing the desired oxygen permeability and removability on development. Also, it may partially have other copolymerization component. Examples of the polyvinyl alcohol include those which are hydrolyzed to an extent of 71 to 100% and have a polymerization degree in a range of 300 to 2,400. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all of which are produced by Kuraray Co., Ltd., are enumerated. The polyvinyl alcohols may be used individually or in combination.

According to a preferable embodiment of the invention, the content of the polyvinyl alcohol and water-soluble resin in the protective layer is from 20 to 95% by weight, and more preferably from 30 to 90% by weight.

(Vinyl Pyrrolidone/Vinyl Imidazole Copolymer)

The vinyl pyrrolidone/vinyl imidazole copolymer is obtained by copolymerization of 1-vinyl imidazole and N-vinyl pyrrolidone. The copolymerization can be easily carried out by using a known radical polymerization initiator. The vinyl pyrrolidone/vinyl imidazole copolymer used in the invention preferably contain from 10 to 98% by mole of 1-vinyl imidazole. The weight average molecular weight of the vinyl pyrrolidone/vinyl imidazole copolymer used in the invention is preferably from 10,000 to 300,000.

As the vinyl pyrrolidone/vinyl imidazole copolymer for use in the invention, a commercially available product, for example, Luvitec VPI55K72W, produced by BASF AG can be utilized.

(Vinyl Pyrrolidone/Vinyl Caprolactam Copolymer)

The vinyl pyrrolidone/vinyl caprolactam copolymer is preferably that containing 30% by mole or more of vinyl caprolactam. The weigh average molecular weight of the vinyl pyrrolidone/vinyl caprolactam copolymer used in the invention is preferably from 10,000 to 300,000.

As the vinyl pyrrolidone/vinyl caprolactam copolymer for use in the invention, a commercially available product, for example, Luvitec VPC55K65W, produced by BASF AG can be utilized.

(Anion-Modified Polyvinyl Alcohol)

The anion-modified polyvinyl alcohol is also preferable as the water-soluble resin having oxygen permeability higher than oxygen permeability of the polyvinyl alcohol having a saponification degree of 95% by mole or more in the invention. Sulfonic acid-modified polyvinyl alcohol is more preferable. The modification ratio of anion is preferably from 0.1 to 5.0% by mole. The weight average molecular weight is preferably from 10,000 to 300,000.

As the anion-modified polyvinyl alcohol for use in the invention, a commercially available product, for example, Gosenal T330, T330S, T330H, T330ST, T350, T230, T215 and T-HS-1 and Goseran F78, L0301, L0302, L3266, and CKS50 (trade names) all of which are produced by Nippon Synthetic Chemical Industry Co., Ltd., and Kuraray C Polymer C506 and CM318 (trade names) all of which are produced by Kuraray Co, Ltd, can be utilized.

The use of polyvinyl pyrrolidone or modified product thereof in the protective layer is preferable in view of the control of the oxygen permeability and removability on development. The content of the polyvinyl pyrrolidone or modified product thereof in the protective layer is desirable from 3.5 to 80% by weight preferably from 10 to 60% by weight, and more preferably from 15 to 30% by weight.

In the protective layer, a water-soluble polymer containing a sulfonic acid group or an alkali metal salt or ammonium salt of sulfonic acid (hereinafter, the sulfonic acid group and alkali metal salt or ammonium salt of sulfonic acid are collectively referred to as "sulfonic acid group") can be used separately from the above-described polymer. For example, an easily water-soluble polymer containing a sulfonic acid group can be used without any particular restriction, and a polymer or copolymer of a polymerizable monomer containing a sulfonic acid group is preferably used, Examples of the polymerizable monomer containing a sulfonic acid group include a sulfonic acid, for example, p-vinylbenzenesulfonic acid, 2-acrylamido-2-methylpropanesulfonic acid, ethylenesulfonic acid, 2-chloroethylenesulfonic acid, ethylenedisulfonic acid, 1 propene-1-sulfonic acid, 1-propene-2-sulfonic acid, 2-methyl-1,3-propenedisulfonic acid, 1-bytyne-1-sulfonic acid, 1-pentene-1-sulfonic, avid, 1-hexene-1-sulfonic acid, 2-phenylethylenesulfonic acid, 1-methyl-2-phenylethylenesulfonic acid, 3-chloroallylsulfonic acid, allylsulfonic acid, 3-chloro-2-butenesulfonic acid, 3-chloromethallylsulfonic acid, methallylsulfonic acid, 3-methyl-2-butene-2-sulfonic acid, 3-phenylallylsulfonic acid, 3-phenylmethallylsulfonic acid, 3-benzylallylsulfonic acid, 2-chloro-4-styrenesulfonic acid, vinyltoluenesulfonic acid or α-methylstyrenesulfonic acid, or an alkali metal salt or ammonium salt thereof. Among them, p-vinylbenzenesulfonic acid, 2-acrylamido-2-methylpropanesulfonic acid and ethylenesulfonic acid are particularly preferable monomers containing a sulfonic acid group. One or more of the monomers are appropriately selected and polymerized or copolymerized with other monomer.

In the case of copolymerization with other monomer, any monomer that can be copolymerized with the monomer containing a sulfonic acid group can be used. Particularly preferable examples of such a monomer include, alkyl acrylates (for example, methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate or 2-hydroxyethyl acrylate), alkyl methacrylates (for example, methyl methacrylate, ethyl methacrylate, n-propyl methacrylate, isopropyl methacrylate, n-butyl metacrylate, isobutyl methacrylate, n-amyl methacrylate, 2-ethylhexyl methacrylate, n-octyl methacrylate, n-decyl methacrylate or 2-hydroxyethyl methacrylate), styrenes (for example, styrene, o-methylstyrene, m-methylstyrene, p-methylstyrene, 2,4-dimethylstyrene, 2,3-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p-chlorostyrene, 2,4-dichlorostyrene, 2,5-dichlorostyrene, 2,6-dichlorostyrene, 3,4-dichlorostyrene, p-bromostyrene or p-cyanostyrene), acrylonitrile, methacrylonitrile, acrylamide, N-sec-butylacrylamide, N-tert-butylacrylamide, N,N-dibutylacrylamide, N-tert-butylmethacrylamide, acrylic acid, methacrylic acid and vinyl acetate.

Particularly preferable examples of the water-soluble polymer for use in the invention include a copolymer of isobutyl methacrylate and 2-acrylamido-2-methylpropanesulfonic acid, a copolymer of methyl methacrylate, ethyl methacrylate and 2-acrylamido-2-methylpropanesulfonic acid, a copolymer of methyl methacrylate, ethyl methacrylate and p-vinylbenzenesulfonic acid, a copolymer of methyl methacrylate and p-vinylbenzenesulfonic acid, alkali metal salts or ammonium salts of these copolymer, and copolymers of a (meth) acrylate and 2-acrylamido-2-methylpropanesulfonic acid or p-vinylbenzenesulfonic acid.

The molecular weight of the water-soluble polymer for use in the invention is not particularly restricted as long as it is water-soluble. As an ordinary guide, it is suitable in a range of about 1,000 to about 1,000,000, preferably in a range of 2,000 to 100,000, and most preferably in a range of 10,000 to 100,000.

The amount of the monomer unit containing a sulfonic acid group in the water-soluble polymer is widely selected and it is preferably in a range of about 1 to 100% by mole, and more preferably in a range of 5 to 100% by mole.

The amount of the water-soluble polymer containing a sulfonic acid group added is preferably from 0.5 to 10% by weight, more preferably from 0.5 to 5% by weight, still more preferably from 1 to 3% by weight, based on the total weight of the protective layer.

As other component of the protective layer, glycerin, dipropylene glycol or the like can be added in an amount corresponding to several % by weight of the polyvinyl alcohol and water-soluble resin to provide flexibility. Further, an anionic surfactant, for example, sodium alkylsulfate or sodium alkylsulfonate; an amphoteric surfactant, for example, alkylaminocarboxylate and alkylaminodicarboxylate; a nonionic surfactant for example, polyoxyethylene alkyl phenyl ether; or a water-soluble polymer containing a sulfonic acid group or an alkali metal salt or ammonium salt of sulfonic acid can be added in an amount ranging from 0.5 to 10% by weight based on the polyvinyl alcohol and water-soluble resin.

The adhesion property to the photosensitive layer and scratch resistance are also extremely important in view of handling of the lithographic printing plate precursor. Specifically, when a hydrophilic layer comprising a water-soluble polymer is laminated on an oleophilic photosensitive layer, layer peeling due to insufficient adhesion property is liable to occur, and the peeled portion causes such a defect as failure in curing of the photosensitive layer due to polymerization inhibition by oxygen. Various proposals have been made for improving the adhesion property between the photosensitive layer and the protective layer. For instance, it is described in JP-B-54-12215 and West German Patent Publication No. 2,127,767 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

The dry coating weight of the protective layer is determined taking the adhesion property and scratch resistance as welt as the oxygen permeability and removability on development into consideration. According to the invention, the dry coating weight of the protective layer is preferably in a range of 0.7 to 3.0 g/m$^2$, more preferably in a range of 1.5 to 2.8 g/m$^2$, and most preferably in a range of 2.1 to 2.7 g/m$^2$. When the dry coating amount is less than 0.7 g/m$^2$, the sensitivity and scratch resistance may decrease in some cases, whereas when it exceeds 3.0 g/m$^2$, the removability on development may deteriorate in some cases.

As a solvent used for coating the protective layer in the photosensitive lithographic printing plate precursor according to the invention, although water is preferable, a mixture of water with an alcohol, for example, methanol or ethanol or a ketone, for example, acetone or methyl ethyl ketone may be used. The concentration of the solid content in the coating solution is appropriately from 1 to 20% by weight. To the protective layer according to the invention may be added a known additive, for example, a surfactant for improving coating property or a water-soluble plasticizer for improving physical property of the coated layer. Examples of the water-soluble plasticizer include propionamide, cyclohexanediol, glycerin and sorbitol. Also, a water-soluble (meth)acrylic polymer may be added.

The coating amount of the known additive is ordinarily in a range of 0.1 to 2.5 g/m$^2$, preferably in a range of 0.1 to about 2.0 g/m, in terms of weight after drying.

[Plate-Making Method]

Now, a plate-making method of the photosensitive lithographic printing plate precursor according to the invention is described in detail below. As for the exposure method of the photosensitive lithographic printing plate precursor, an AlGaInN semiconductor laser (commercially available InGaN semiconductor laser: 5 to 30 mW) is preferably used as a light source in view of wavelength characteristics and cost.

The exposure mechanism (plate setter) may be any of internal drum system, external drum system and flat bed system.

When a highly water-soluble component is used in the photosensitive layer of the photosensitive lithographic printing plate precursor according to the invention, the photosensitive layer can be made soluble in neutral water or alkalescent water, and the photosensitive lithographic printing plate precursor having such a construction can be subjected to on-machine development and can be used in a system wherein after loading the photosensitive lithographic printing plate precursor on a printing machine, it is exposed and developed on the printing machine.

After the imagewise exposure, the entire surface of the photosensitive lithographic printing plate precursor may be heated, if desired, between the exposure and development. By means of the heating, the image forming reaction in the photosensitive layer is accelerated and advantages, for example, improvements in the sensitivity and printing durability and stabilization of the sensitivity are achieved. For the purpose of improving the image strength and printing durability, it is also effective to perform entire after-heating or entire exposure of the image after development. Ordinarily, the heating before development is preferably performed under a mild condition of 150° C. or lower. When the temperature is too high, a problem, for example, in that the non-image area is also fogged may arise. In the heating after development, a very strong condition is utilized. The temperature is ordinarily in a rage of 200 to 500° C. When the temperature is too low, the sufficient image-strengthening function can not be obtained, whereas when it is too high, problems, for example, of degradation of the support and thermal decomposition of the image area may arise.

[Developer]

The developer for use in the plate-making method of the lithographic printing plate precursor is not particularly restricted and, for example, a solution containing an inorganic alkali salt and a nonionic surfactant and having a pH of 11.0 to 12.5 is preferably used.

The inorganic alkali salt can be appropriately used. Examples thereof include an inorganic alkali agent, for example, sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. The inorganic alkali salts may be used individually or in combination of two or more thereof.

In the case of using the silicate, the developing property can be easily adjusted by selecting a mixing ratio of silicon oxide ($SiO_2$) to alkali oxide ($M_2O$ (wherein M represents an alkali metal or an ammonium group)), which are the components of the silicate, and the concentration thereof. Of the aqueous alkali solutions, an aqueous alkali solution having the mixing ratio of silicon oxide ($SiO_2$) to alkali oxide ($M_2O$) ($SiO_2/M_2O$ in molar ratio) of 0.5 to 3.0 is preferred, and that of 1.0 to 2.0 is more preferred. The total amount of the $SiO_2/M_2O$ added is preferably from 1 to 10% by weight, more preferably from 3 to 8% by weight, and most preferably from 4 to 7% by weight, based on the weight of the aqueous alkali solution. When the amount is 1% by weight or more, the developing property and processing ability are not deteriorated whereas, when it is 10% by weight or less, the formation of precipitates and crystals is inhibited and gelation at neutralization of waste liquor of the developer is prevented, thereby causing no troubles in treatment of the waste liquor.

Also, an organic alkali agent may be supplementarily used for the purposes of delicate adjustment of alkali concentration and of assisting dissolution of the photosensitive layer. Examples of the organic alkali agent includes monomethylamine, dimethylamine, trimethylamine, monoethylamine, diethylamine, triethylamine, monoisopropylamine, diisopropylamine, triisopropylamine, n-butylamine, monoethanolamine, diethanolamine triethanolamine, monoisopropanolamine, diisopropanolamine, ethyleneimine, etylenediamine, pyridine and tetramethylammonium hydroxide. The organic alkali agents may be used individually or in combination of two or more thereof.

The surfactant is appropriately used, Examples thereof include nonionic surfactants, for example, a nonionic surfactant having polyoxyalkylene ether group, a polyoxyethylene alkyl ester (e.g., polyoxyethylene stearate) a sorbitan alkyl ester (e.g., sorbitan monolaurate, sorbitan monostearate, sorbitan distearate, sorbitan monooleate, sorbitan sesquioleate or sorbitan trioleate) and a monoglyceride alkyl ester (e.g., glycerol monostearate or glycerol monooleate); anionic surfactants, for example, an alkylbenzenesulfonate (e.g., sodium dodecylbezenesulfonate), an alkylnaphthalenesulfonate (e.g., sodium butylnaphthalenesulfonate, sodium pentylnaphthalenesulfonate, sodium hexylnaphthalenesulfonate or sodium octytnaphthalenesulfonate), an alkylsulfate (e.g., sodium laurylsulfate), an alkylsulfonate (e.g., sodium dodecylsulfonate) and a sulfosuccinic acid ester salt (e.g., sodium dilaurylsulfosuccinate); and amphoteric surfactants, for example, an alkylbetaine (e.g., laurylbetaine or stearylbetaine) and an amino acid. Nonionic surfactants having a polyoxyalkylene ether group are particularly preferred.

As the surfactant having a polyoxyalkylene ether group, compounds having the structure represented by formula (12) shown below are preferably used.

$$R40\text{-}O\text{---}(R41\text{-}O)_p H \qquad (12)$$

In formula (12), R40 represents an alkyl group having from 3 to 15 carbon atoms which may have a substituent, an aromatic hydrocarbon group having from 6 to 15 carbon atoms which may have a substituent or a heteroaromatic ring group having from 4 to 15 carbon atoms which may have a substituent. Examples of the substituent include an alkyl group having from 1 to 20 carbon atoms, a halogen atom, e.g., Br, Cl or I, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms. R41 represents an alkylene group having from 1 to 100 carbon atoms which may have a substituent. Examples of the substituent include an alkyl group having from 1 to 20 carbon atoms and an aromatic hydrocarbon group having from 6 to 15 carbon atoms. p represents an integer of 1 to 100.

In the definition of formula (12), specific examples of the "aromatic hydrocarbon group" include a phenyl group, a tolyl group, a naphthyl group, an anthryl group, a biphenyl group and a phenanthryl group, and specific examples of the "heteroaromatic ring group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group and a benzimidazolyl group.

Also, the moiety of $(R41\text{-}O)_p$ in formula (12) may comprise two or three kinds of groups to the extent at the above-described definitions are fulfilled. Specifically, there may be illustrated a random or block chain of a combination of ethyleneoxy group and propyleneoxy group, a combination of ethyleneoxy group and isopropyleneoxy group, a combination of ethyleneoxy group and butyleneoxy group, and a combination of ethyleneoxy group and isobutyleneoxy group. In the invention, the surfactants having polyoxyalkylene ether group are used individually or in combination thereof. The surfactant is effectively added in an amount from 1 to 30% by weight, preferably from 2 to 20% by weight, to the developer. When the amount is too small, the developing property may decrease. On the contrary, when it is too large, damage of the development may increase and the printing durability of the resulting printing plate may decrease.

Examples of the nonionic surfactant having polyoxyalkylene ether group represented by formula (12) include a polyoxyethylene alkyl ether, e.g., polyoxyethylene lauryl ether, polyoxyethylene cetyl ether or polyoxyethylene stearyl ether; a polyoxyethylene aryl ether, e.g., polyoxyethylene phenyl ether or polyoxyethylene naphthyl ether; and a polyoxyethylene alkylaryl ether, e.g., polyoxyethylene methylphenyl ether, polyoxyethylene octylphenyl ether or polyoxyethylene nonylphenyl ether.

The surfactants can be used individually or in combination thereof. Also, the amount of the surfactant used in the developer is preferably in a range of 0.1 to 20% by weight in terms of the active ingredient.

The pH of the developer for use in the plate-making of the photosensitive lithographic printing plate precursor according to the invention is not particularly restricted and it is preferably from 11.0 to 12.7, and more preferably from 11.5 to 12.5. When the pH is 11.0 or more, the formation of image is surely performed, whereas when it is 12.7 or less over development is prevented and the exposed area does not suffer the damage due to the development.

Further, the electric conductivity of the developer is preferably from 3 to 30 mS/cm. When the electric conductivity is 3 mS/cm or more, dissolution of the photopolymerization type photosensitive layer on the aluminum support surface can be surely conducted to prevent the occurrence of stain at printing, whereas when it is 30 mS/cm or less, since the salt concentration is not too high, a dissolution rate of the photopolymerization type photosensitive layer does not become extremely low, thereby preventing the occurrence of remaining layer in the unexposed area. The electric conductivity is particularly preferably in a range of 5 to 20 mS/cm.

The development of the photosensitive lithographic printing plate precursor according to the invention is conducted at a temperature from 0 to 60° C., preferably from about 15 to about 40° C., in a conventional manner, for example, by immersing the exposed photosensitive lithographic printing plate precursor in the developer and rubbing it with a brush.

Further, in the case of conducting the development processing using an automatic developing machine, since the developer becomes fatigued in accordance with the amount of processing, the processing ability may be restored by using a replenisher or a fresh developer.

The thus development-processed photosensitive lithographic printing plate precursor is subjected to after-treatment with washing water, a rinse solution containing, for example, a surfactant, or an oil-desensitizing solution containing, for example, gum arabic or a starch derivative, as described, for example, in JP-A-54-8002, JP-A-55-115045 and JP-A-59-58431. In the after-treatment of the photosensitive lithographic printing plate precursor according to the invention, these treatments may be used in combination.

The printing plate thus-obtained in accordance with the above-described processing can be improved in the printing durability thereof by conducting an after-exposure treatment according to the method described in JP-A-2000-89478 or a heat treatment, for example, baking.

The lithographic printing plate thus-obtained is mounted on an offset printing machine to use for printing a large number of sheets.

EXAMPLES

The present invention will be described in more detail with reference to the following examples, but the invention should not be construed as being limited thereto.

Examples 1 to 3

Preparation of Support (1) Support 1: Anodized Aluminum Support

A 0.30-mm thick aluminum plate of 1S material was grained at the surface thereof using a No. 8 nylon brush and an aqueous suspension containing 800-mesh pumice stone, and then thoroughly washed with water. The plate was immersed in a 10% by weight aqueous sodium hydroxide solution at 70° C. for 60 seconds to conduct to etching, followed by washing with running water, neutralizing with 20% by weight aqueous nitric acid solution, and then washing with water. The plate was then subjected to the electrolytic surface roughening treatment in a 1% by weight aqueous nitric acid solution under the condition of VA=12.7 V at an anodic time electricity of 300 Coulomb/dm² using a current having am alternating sine wave form. The surface roughness was measured and found to be 0.45 μm (in terms of Ra). Subsequently, the plate was immersed in a 30% by weight aqueous sulfuric acid solution of 55° C. to desmut for 2 minutes. Then, the plate was anodized in a 20% by weight aqueous sulfuric acid solution of 33° C. at an electric current of 5 A/dm² for 50 seconds with disposing a cathode to the grained surface. The amount of the anodic oxide film was 2.6 g/m². The resulting aluminum plate was referred to as Support 1.

(1) Support 2: Support Having Intermediate Layer

On support 1 above was coated Coating solution for intermediate layer 1 shown below using a bar coater so as to have a dry coating amount of 30 mg/m² and dried at 150° C. for 5 seconds to prepare Support 2.

| Coating solution for intermediate layer 1 | |
| --- | --- |
| Tetraethyl silicate | 4.0 parts by weight |
| Compound 1 shown below | 1.2 parts by weight |
| Compound 2 shown below | 11.0 parts by weight |
| Methanol | 5.0 parts by weight |
| Aqueous phosphoric acid solution (85%) | 2.5 parts by weight |

The above components were mixed and stirred and after about 30 minutes heat generation was stated. After the mixture was stilled to react for 60 minutes, the solution shown below was added thereto to prepare Coating solution for intermediate layer 1.

| Solution | |
| --- | --- |
| Methanol | 2,000 parts by weight |
| 1-Methoxy-2-propanol | 100 parts by weight |

Compound 1:

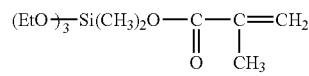

Compound 2:

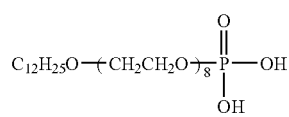

(Preparation of Photopolymerization Type Photosensitive Lithographic Printing Plate Precursor)

On Support 2 was coated Photosensitive composition (1) having the components shown below using a bar coater, followed by drying at 90° C. for one minute to form Photosensitive layer (1). The weight of the photosensitive layer after drying was 1.35 g/m².

| Photosensitive composition (1) | |
| --- | --- |
| Addition polymerizable compound having ethylenically unsaturated double bond (PELEX 6661-O, produced by Degussa AG) | 1.69 parts by weight |
| Binder polymer (Compound 3 shown below, weight average molecular weight: 80,000) | 1.87 parts by weight |
| Sensitizing dye (Compound D40 shown below) | 0.13 parts by weight |
| Hexaarylbiimidazole photopolymerization initiator (BIMD, produced by Kurogane Kasei Co., Ltd.) | 0.46 parts by weight |
| ε-Phthalocyanine (F-1 shown below) dispersion (25% by weight methyl ethyl ketone dispersion) | 1.70 parts by weight |
| Mercapto group-containing compound (Compound SH-1 shown below) | 0.34 parts by weight |
| Fluorine-based nonionic surfactant (Megafac F-780F, produced by Dainippon Ink and Chemicals, Inc.) | 0.03 psrts by weight |
| Cupferron AL (produced by Wako Pure Chemical Industries, Ltd) (10% by weight tricresyl phosphate solution) | 0.12 parts by weight |
| Methyl ethyl ketone | 27.0 parts by weight |
| Propylene glycol monomethyl ether | 26.7 parts by weight |

Compound 3:

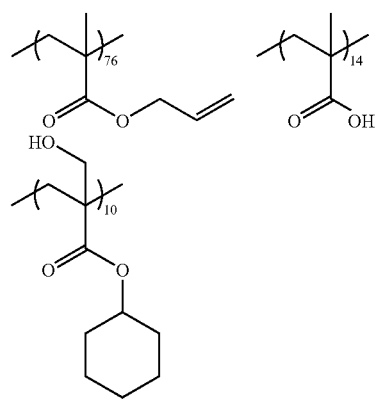

-continued

Compound D40:

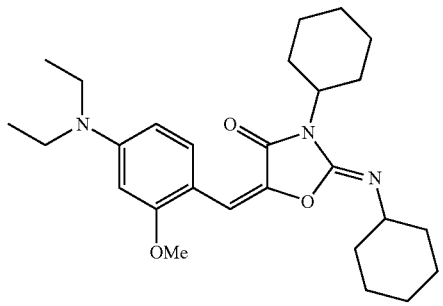

F-1

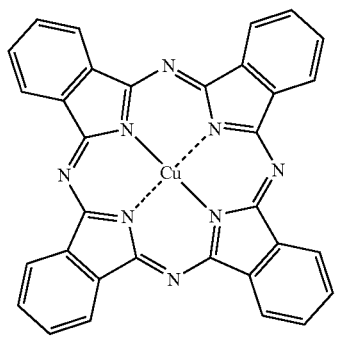

Mercapto group-containing compound SH-1:

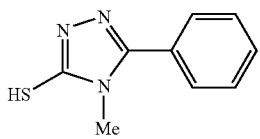

| Composition of aqueous coating solution for protective layer | |
|---|---|
| Polyvinyl alcohol (saponification degree: 95% by mole; polymerization degree: 500) | amount shown in Table 1 |
| Water-soluble resin shown in Table 1 | amount shown in Table 1 |
| Polymer SP-1 shown below | 2.0 parts by weight |
| Luviskol VA64W (50% aqueous solution, produced by BASF AG) | 1.2 parts by weight |
| Nonionic surfactant (Pionin D230, produced by Takemoto Oil & Fat Co., Ltd.) | 2.0 parts by weight |
| Nonionic surfactant (Emalex 710, produced by Nihon-Emulsion Co., Ltd.) | 1.8 parts by weight |
| Water | 1,100 parts by weight |

Polymer SP-1:

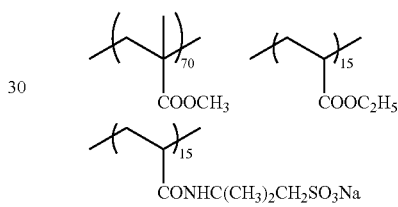

TABLE 1

| | Water-soluble Resin | Amount added | Amount of Polyvinyl Alcohol added (saponification degree: 95% by mole; Polymerization degree: 500) |
|---|---|---|---|
| Example 1 | Luvitec VPC55K65W, produced by BASF AG (vinyl pyrrolidone/vinyl caprolactam copolymer, aqueous solution of 30% solid content) | 46.5 parts by weight | 79.05 parts by weight |
| Example 2 | Luvitec VPI55K72W, produced by BASF AG (vinyl pyrrolidone/vinyl imidazole copolymer, aqueous solution of 20% solid content) | 67.5 parts by weight | 79.05 parts by weight |
| Example 3 | Goseran CKS50, produced by Nippon Synthetic Chemical Industry Co., Ltd. (anion-modified polyvinyl alcohol) | 33.6 parts by weight | 62.4 parts by weight |

On the photosensitive layer was coated an aqueous coating solution for protective layer having the composition shown below using a bar coater so as to have a dry coating weight of 2.5 g/m², followed by drying at 120° C. for one minute. Thus, a lithographic printing plate precursor was prepared.

Examples 4 to 6

Lithographic printing plate precursors were prepared in the same manner as in Examples 1 to 3 except for changing the Composition of aqueous coating solution for protective layer to that shown below, respectively.

| Composition of aqueous coating solution for protective layer | |
| --- | --- |
| Polyvinyl alcohol (saponification degree: 95% by mole; polymerization degree: 500) | amount shown in Table 2 |
| Water-soluble resin shown in Table 1 | amount shown in Table 2 |
| Polymer SP-1 shown above | 2.0 parts by weight |
| Luviskol VA64W (50% aqueous solution, produced by BASF AG) | 1.2 parts by weight |
| Nonionic surfactant (Pionin D230, produced by Takemoto Oil & Fat Co., Ltd.) | 2.0 parts by weight |
| Nonionic surfactant (Emalex 710, produced by Nihon-Emulsion Co., Ltd.) | 1.8 parts by weight |
| Water | 1,000 parts by weight |

TABLE 2

| | Water-soluble Resin | Amount added | Amount of Polyvinyl Alcohol added (saponification degree: 95% by mole; Polymerization degree: 500) |
| --- | --- | --- | --- |
| Example 4 | Luvitec VPC55K65W, produced by BASF AG (vinyl pyrrolidone/vinyl caprolactam copolymer, aqueous solution of 30% solid content) | 160.0 parts by weight | 48.0 parts by weight |
| Example 5 | Luvitec VPI55K72W, produced by BASF AG (vinyl pyrrolidone/vinyl imidazole copolymer, aqueous solution of 20% solid content) | 240.0 parts by weight | 48.0 parts by weight |
| Example 6 | Goseran CKS50, produced by Nippon Synthetic Chemical Industry Co., Ltd. (anion-modified polyvinyl alcohol) | 86.4 parts by weight | 9.6 parts by weight |

Comparative Example 1

A lithographic printing plate precursor was prepared in the same manner as in Examples 1 to 3 except for changing the Composition of aqueous coating solution for protective layer to that shown below.

| Composition of aqueous coating solution for protective layer | |
| --- | --- |
| Polyvinyl alcohol (saponification degree: 95% by mole; polymerization degree: 500) | 93.0 parts by weight |
| Polymer SP-1 shown above | 2.0 parts by weight |
| Luviskol VA64W (50% aqueous solution, produced by BASF AG) | 1.2 parts by weight |
| Nonionic surfactant (Pionin D230, produced by Takemoto Oil & Fat Co., Ltd.) | 2.0 parts by weight |
| Nonionic surfactant (Emalex 710, produced by Nihon-Emulsion Co., Ltd.) | 1.8 parts by weight |
| Water | 1,000 parts by weight |

Comparative Example 2

A lithographic printing plate precursor was prepared in the same manner as in Example 1 except that Photosensitive composition (1) was changed to Photosensitive composition (2) shown below to form Photosensitive layer (2).

| Photosensitive composition (2) | |
| --- | --- |
| Ethylenically unsaturated bond-containing compound (A1) | 1.0 part by weight |
| Polymer binder (B1) | 2.0 parts by weight |
| Sensitizing dye (Compound D32) | 0.15 parts by weight |
| Photopolymerization initiator (C1) | 0.12 parts by weight |
| ε-Phthalocyanine (F1) dispersion | 0.02 parts by weight |
| Sensitizing auxiliary (G1) | 0.5 parts by weight |

-continued

| Photosensitive composition (2) | |
| --- | --- |
| Fluorine-based nonionic surfactant (Megafac F-780F, produced by Dainippon Ink and Chemicals, Inc.) | 0.02 parts by weight |
| Methyl ethyl ketone | 26.0 parts by weight |
| Propylene glycol monomethyl ether | 26.3 parts by weight |

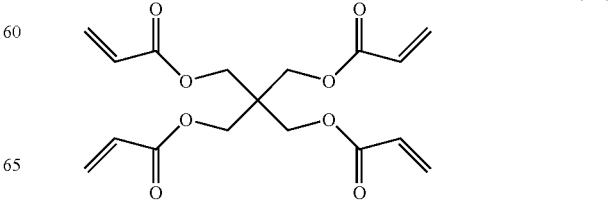

(A1)

-continued

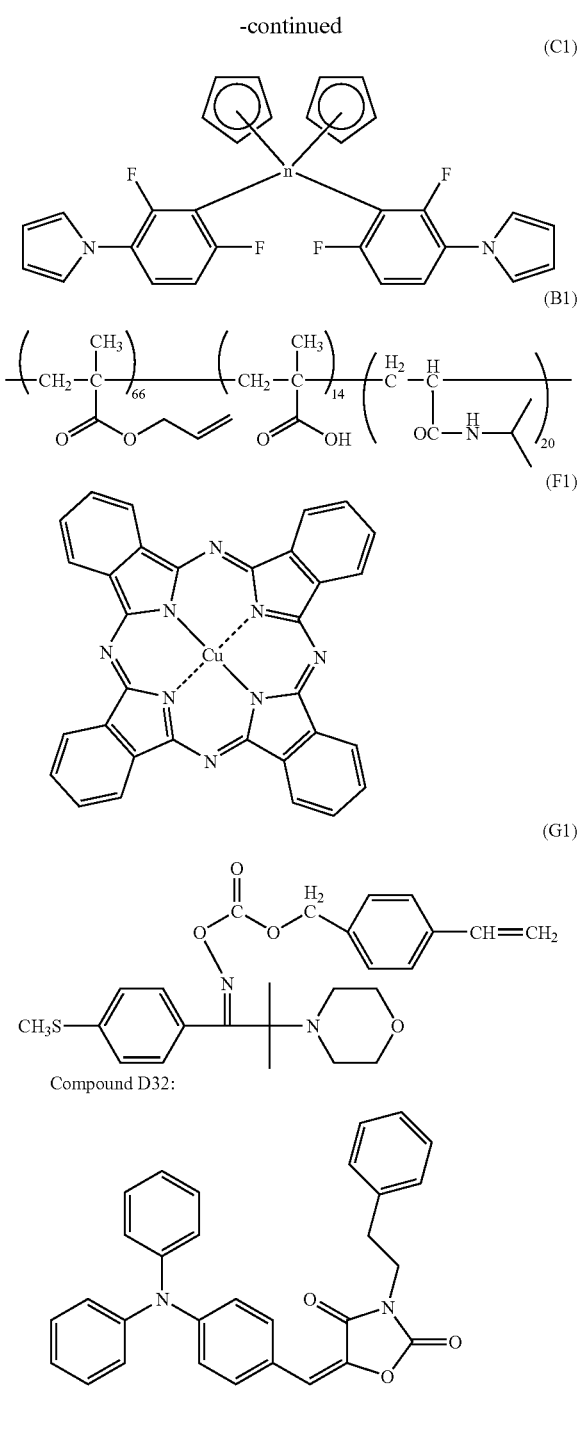

Comparative Example 3

A lithographic printing plate precursor was prepared in the same manner as in Example 1 except for using methacrylic acid/allyl methacrylate copolymer (ratio of repeating unit=15/85 weight average molecular weight=80,000) in place of Binder polymer (Compound 3) in the photosensitive composition to form Photosensitive layer (3).

(Evaluation of Sensitivity)

The photosensitive lithographic printing plate precursor was cut into a piece of 700 mm long and 500 mm wide and loaded in a violet semiconductor laser setter Vx9600 (InGaN semiconductor laser: 405 nm±10 nm emission/output: 30 mW, produced by FUJIFILM Electronic Imaging, Ltd.) and thereon were drawn halftone dots of 35% using an FM screen (TAFFETA 20, produced by Fuji Photo Film Co., Ltd.) in an exposure amount of 90 µJ/cm² and resolution of 2,438 dpi. The exposed photosensitive lithographic printing plate precursor was automatically conveyed to a connecting automatic developing machine (LP1250PLX) (equipped with brushes), and it was heated at 100° C. for 10 seconds, washed with water to remove the protective layer and continuously subjected to development processing at 28° C. for 20 seconds. The developed plate was washed with water in a rinse bath and conveyed to a gum coating bath. After the gum coating, the plate was dried with hot air and discharged to obtain a lithographic printing plate having the halftone dots drawn. The developer used was a solution prepared by diluting Developer DV-2 (produced by Fuji Photo Film Co., Ltd.) five times with water. The gum solution was a solution prepared by diluting Gum Solution FP-2W (produced by Fuji Photo Film Co., Ltd.) twice with water. An area ratio of the halftone dot of the lithographic printing plate was measured at 24 points at 10 cm horizontal and vertical intervals using CC-dot and the average value thereof was determined. The results are shown in Table 3 below.

(Evaluation of Unevenness of Halftone Dot)

The area ratio of the halftone dot of the lithographic printing plate prepared in the same manner as in the evaluation of sensitivity was measured at 24 points at 10 cm horizontal and vertical intervals using CC-dot and an area difference (δ dot) between the maximum value and the minimum value was determined. The results are shown in Table 3 below.

(Evaluation of Preservation Stability)

The photosensitive lithographic printing plate precursor was packaged with aluminum craft paper, heated in an oven controlled at 60° C. for 3 days, and then cooled to room temperature. Using the photosensitive lithographic printing plate precursor, the evaluation of sensitivity was conducted in the same manner as in the evaluation of sensitivity and the average value of 24 points measured was determined. A difference (δ dot) between the value thus-obtained and the value obtained without conducting the heating at 60° C. was determined. The results are shown in Table 3 below.

(Evaluation of Oxygen Permeability)

On a surface of photographic printing paper having a thickness of 200 µm both surfaces of which had been coated with polyethylene having a thickness of 20 µm was coated the protective layer in the same manner as described in the coating of protective layer on the photosensitive layer, followed by drying to prepare a sample for measurement. The oxygen permeability of the photographic printing paper previously measured was about 700 ml/(m²·day) under the measurement conditions described below and it was a sufficiently negligible value for the measurement of the oxygen permeability of the protective layer.

Using the sample thus-prepared, the oxygen permeability [ml/(m²·day)] was measured by OX-TRAN2/20 produced by Mocon Inc. according to the vapor permeation rate testing method described in JIS K7126B and ASTM D3985 under the conditions of 25° C. and 60% RH.

TABLE 3

| | Photosensitive Layer | Protective Layer Water-soluble Resin | PVA:Water-soluble Resin | Oxygen Permeability (ml/m²·day) | Sensitivity (dot %) | Unevenness of Halftone Dot (δ dot %) | Preservation Stability (δ dot %) |
|---|---|---|---|---|---|---|---|
| Example 1 | Photosensitive Layer 1 | Luvitec VPC55K65W | 8.5:1.5 | 28 | 57 | 2.0 | 2.0 |
| Example 2 | Photosensitive Layer 1 | Luvitec VPI55K72W | 8.5:1.5 | 26 | 57 | 2.0 | 2.0 |
| Example 3 | Photosensitive Layer 1 | Goseran CKS50 | 6.5:3.5 | 25 | 58 | 2.0 | 2.0 |
| Example 4 | Photosensitive Layer 1 | Luvitec VPC55K65W | 5:5 | 59 | 54 | 1.5 | 1.5 |
| Example 5 | Photosensitive Layer 1 | Luvitec VPI55K72W | 5:5 | 50 | 55 | 1.5 | 1.5 |
| Example 6 | Photosensitive Layer 1 | Goseran CKS50 | 1:9 | 45 | 57 | 1.8 | 1.5 |
| Comparative Example 1 | Photosensitive Layer 1 | — | 10:0 | 4.5 | 58 | 3.0 | 4.0 |
| Comparative Example 2 | Photosensitive Layer 2 | Luvitec VPC55K65W | 8.5:1.5 | 28 | 51 | 2.0 | 2.0 |
| Comparative Example 3 | Photosensitive Layer 3 | Luvitec VPC55K65W | 8.5:1.5 | 28 | 45 | 5.0 | 2.0 |

Allowable range of the unevenness of halftone dot:
δ dot %=±2.0%
Allowable range of the preservation stability:
δ dot %=±2.0%

From the results of Examples 1 to 6 and Comparative Examples 1 to 3 shown in Table 3, it is confirmed that simultaneous pursuit of the sensitivity, unevenness of halftone dot and preservation stability can be achieved by the combination of the photosensitive layer containing the specific component and the protective layer having the controlled oxygen permeability.

This application is based on Japanese Patent application JP 2006-263214, filed Sep. 27, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope ad spirit of the invention.

What is claimed is:

1. A negative-working photopolymerization photosensitive lithographic printing plate precursor capable of conducting image recording with laser, comprising: a hydrophilic support; a photopolymerizable photosensitive layer comprising (i) a sensitizing dye having an absorption maximum in a wavelength range of from 360 to 450 nm, (ii) a hexaarylbiimidazole compound and (iii) an addition polymerizable compound having an ethylenically unsaturated double bond; and a protective layer, in this order, wherein the protective layer has oxygen permeability at 25° C. under one atmosphere of from 25 ml/m²·day to 200 ml/m²·day;

wherein the protective layer comprises: polyvinyl alcohol having a saponification degree of 95% by mole or more; and a water-soluble resin having oxygen permeability higher than oxygen permeability of the polyvinyl alcohol having a saponification degree of 95% by mole or more, in a weight ratio of 9:1 to 1:9.

2. The negative-working photopolymerization photosensitive lithographic printing plate precursor as claimed in claim 1, wherein the water-soluble resin having oxygen permeability higher than oxygen permeability of the polyvinyl alcohol having a saponification degree of 95% by mole or more is at least one member selected from a vinyl pyrrolidone/vinyl imidazole copolymer, a vinyl pyrrolidone/vinyl caprolactam copolymer and an anion-modified polyvinyl alcohol.

3. The negative-working photopolymerization photosensitive lithographic printing plate precursor as claimed in claim 1, wherein a dry weight of the protective layer is from 2.1 to 2.7 g/m².

4. The negative-working photopolymerization photosensitive lithographic printing plate precursor as claimed in claim 1, wherein the photopolymerizable photosensitive layer further comprises a binder polymer containing structural units represented by the following formulae (1) to (3):

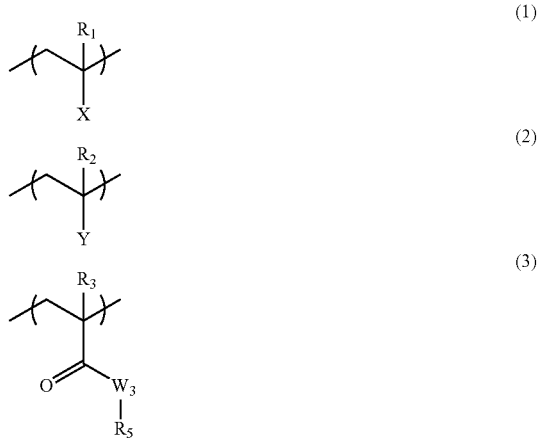

wherein $R_1$ and $R_2$ each independently represents a hydrogen atom or an alkyl group having from 1 to 6 carbon atoms, $R_3$ represents a hydrogen atom, an alkyl group having from 1 to 6 carbon atoms or a substituted alkyl group having from 1 to 6 carbon atoms which is substituted with a hydroxy group, a halogen atom, an amino group, a methoxy group or a carboxyl group, X represents a functional group selected from —COOH, —CO—$W_1$-$L_1$-COOH and —$SO_3H$, $W_1$ represents an oxygen atom, a sulfur atom or a —NH-group, $L_1$ represents a divalent organic group, Y represents —CO—O—$CH_2$—CH=$CH_2$ group or a —CO—$W_2$-$L_2$-O—CO—$CR_4$=$CH_2$ group, $W_2$ represents an oxygen atom, a sulfur atom or a —NH— group, $L_2$ represents a divalent organic group, $R_4$ represents a hydrogen atom or an alkyl group having from 1 to 6 carbon atoms, $W_3$ represents an oxygen atom, a sulfur atom or an —NH— group, and $R_5$ represents an alkyl group having from 1 to 18 carbon atoms, an alkyl group containing an alicyclic structure having from 5 to 20 carbon atoms or a group containing an aromatic ring having from 6 to 20 carbon atoms.

5. The negative-working photopolymerization photosensitive lithographic printing plate precursor as claimed in claim 1, which further comprises an intermediate layer comprising a metal oxide obtained by hydrolysis and polycondensation of an organic metal compound or inorganic metal compound between the hydrophilic support and the photopolymerizable photosensitive layer.

6. The negative-working photopolymerization photosensitive lithographic printing plate precursor as claimed in claim 1, wherein the protective layer has oxygen permeability at 25° C. under one atmosphere of from 35 ml/$m^2$·day to 150 ml/$m^2$·day.

\* \* \* \* \*